United States Patent
Yamahira et al.

(10) Patent No.: US 11,243,246 B2
(45) Date of Patent: Feb. 8, 2022

(54) FUNCTIONAL SAFETY SYSTEM

(71) Applicant: RENESAS ELECTRONICS CORPORATION, Tokyo (JP)

(72) Inventors: Toshiki Yamahira, Tokyo (JP); Toshihiro Kawano, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/950,988

(22) Filed: Nov. 18, 2020

(65) Prior Publication Data

US 2021/0148966 A1  May 20, 2021

(30) Foreign Application Priority Data

Nov. 18, 2019 (JP) .............. JP2019-207942

(51) Int. Cl.
| | |
|---|---|
| *H02P 29/02* | (2016.01) |
| *G01R 31/28* | (2006.01) |
| *H02P 29/032* | (2016.01) |
| *G01R 31/327* | (2006.01) |
| *H01H 9/54* | (2006.01) |
| *H02P 29/024* | (2016.01) |

(52) U.S. Cl.
CPC ..... *G01R 31/2827* (2013.01); *G01R 31/3277* (2013.01); *H01H 9/54* (2013.01); *H02P 29/025* (2013.01); *H02P 29/032* (2016.02)

(58) Field of Classification Search
None
See application file for complete search history.

(56) References Cited

U.S. PATENT DOCUMENTS

2007/0285950 A1  12/2007  Nakamura et al.

FOREIGN PATENT DOCUMENTS

| EP | 2905662 A1 | 8/2015 |
| EP | 3493379 A1 | 6/2019 |
| JP | 2006-302614 A | 11/2006 |
| JP | 2007-310693 A | 11/2007 |
| JP | 5822041 B1 | 11/2015 |

OTHER PUBLICATIONS

Extended European Search Report issued in corresponding European Patent Application No. 20207365.6-1202, dated Apr. 1, 2021.

*Primary Examiner* — Muhammad S Islam
(74) *Attorney, Agent, or Firm* — McDermott Will & Emery LLP

(57) ABSTRACT

A functional safety system with high reliability is provided. The functional safety system includes power source apparatuses VS1 and VS2, voltage monitoring apparatuses VM1 and VM2, semiconductor devices SC1 and SC2, interruption circuits IN1 and IN2, and a motor MT. A the voltage converting circuit DA1 of the voltage monitoring apparatus VM1 generates a detected voltage VA1 from a power source voltage VDD1 on the basis of a switching signal VC1, and a voltage converting circuit DA2 of the voltage monitoring apparatus VM1 generates a detected voltage VA2 from the power source voltage VDD1 on the basis of a switching signal VC1.

20 Claims, 9 Drawing Sheets

| | | POWER SOURCE MONITORING APPARATUS VM1 | | POWER SOURCE MONITORING APPARATUS VM2 | |
|---|---|---|---|---|---|
| | | VC1 = L | VC1 = H | VC2 = L | VC2 = H |
| RECOMMENDED UPPER LIMIT VOLTAGE OF SEMICONDUCTOR DEVICES SC1 AND SC2 | VDD1 OR VDD2 (V) | OA1 | OA1 | OB1 | OB1 |
| | 3.7 | H | H | H | H |
| | 3.6 | H | H | H | H |
| NORMAL OPERATING VOLTAGE RANGE OF FUNCTIONAL SAFETY SYSTEM 1 | 3.5 | L | H | L | H |
| | 3.4 | L | H | L | H |
| | 3.3 | L | H | L | H |
| | 3.2 | L | H | L | H |
| | 3.1 | L | H | L | H |
| RECOMMENDED LOWER LIMIT VOLTAGE OF SEMICONDUCTOR DEVICES SC1 AND SC2 | 3.0 | L | L | L | L |
| | 2.9 | L | L | L | L |

FIG. 7
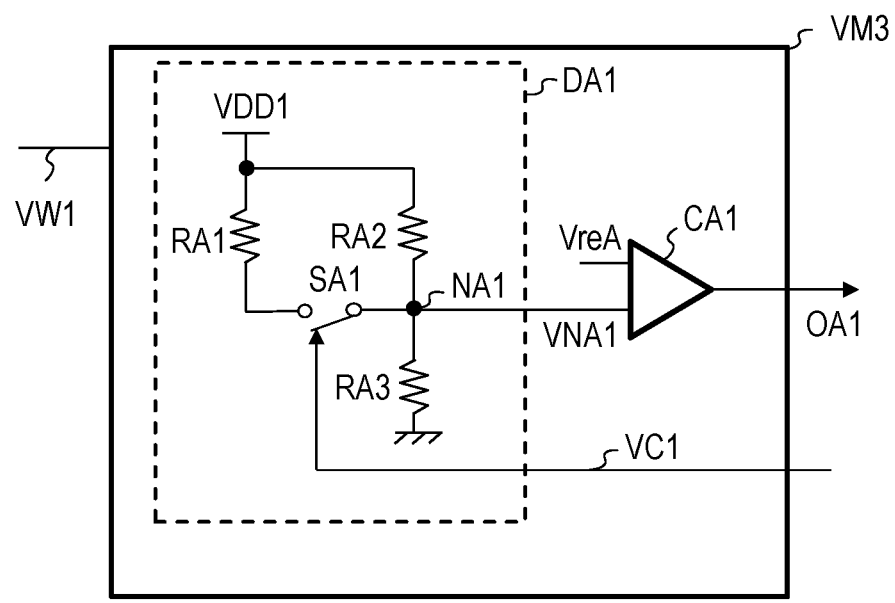
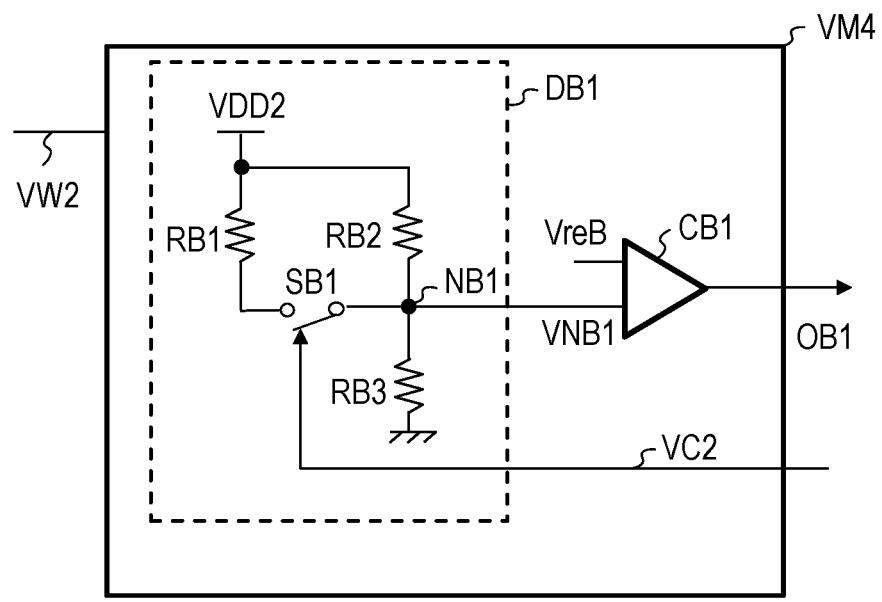

FUNCTIONAL SAFETY SYSTEM

CROSS-REFERENCE TO RELATED APPLICATIONS

The disclosure of Japanese Patent Application No. 2019-207942 filed on Nov. 18, 2019 including the specification, drawings and abstract is incorporated herein by reference in its entirety.

BACKGROUND

The present invention relates to a functional safety system. In recent years, in order to improve reliability of a system, an operation of the system is monitored by using a plurality of monitoring systems. Further, incorporating of a function for safety into the system is called functional safety. A related art is an example in which an operation of the system is monitored by using a plurality of monitoring systems.

A control device of the related art has a first MPU and a second MPU. The second MPU controls an output circuit including a voltage monitoring circuit. Specifically, the second MPU blocks a power source that supplies power to the voltage monitoring circuit. An output result from the voltage monitoring circuit is thereby observed by the first MPU, cross communication between the first MPU and the second MPU is executed, and abnormality of the output circuit is determined.

In this regard, there are disclosed techniques below.

[PATENT DOCUMENT 1] Japanese Unexamined Patent Application Publication No. Japanese unexamined Patent Application publication No. 2006-302614.

SUMMARY

However, in the related art, it is impossible to diagnose a breakdown of the voltage monitoring circuit itself. For that reason, there is a problem that reliability of the control device described in the related art is low. Another problem and a novel feature will be apparent from the description herein and accompanying drawings.

A functional safety system according to one embodiment includes: a first power source apparatus configured to generate a first power source voltage on a basis of an external power source; a first power source monitoring apparatus configured to receive the first power source voltage, and monitor the first power source voltage; and a first semiconductor device configured to receive the first power source voltage to operate on a basis of the first power source voltage. Further, the functional safety system also includes: a second power source apparatus configured to generate a second power source voltage on a basis of the external power source; a second power source monitoring apparatus configured to receive the second power source voltage, and monitor the second power source voltage; and a second semiconductor device configured to receive the second power source voltage to operate on a basis of the second power source voltage. Moreover, the functional safety system also includes: a first interruption circuit controlled by the first semiconductor device; a second interruption circuit controlled by the second semiconductor device; and a motor configured to receive a driving signal via the first interruption circuit and the second interruption circuit to operate on a basis of the driving signal. The first power source monitoring apparatus includes a first voltage converting circuit, a second voltage converting circuit, a first comparator circuit, and a second comparator circuit. The second semiconductor device has a first expected value and a second expected value. The first voltage converting circuit is configured to generate a first detected voltage from the first power source voltage on a basis of a first switching signal supplied from the second semiconductor device, and apply the first detected voltage to the first comparator circuit. The second voltage converting circuit is configured to generate a second detected voltage from the first power source voltage on a basis of the first switching signal, and apply the second detected voltage to the second comparator circuit. The first comparator circuit is configured to compare the first detected voltage with a first reference voltage, and supply a first voltage monitoring result to the second semiconductor device in accordance with a comparison result. The second comparator circuit is configured to compare the second detected voltage with the first reference voltage, and supply a second voltage monitoring result to the second semiconductor device in accordance with a comparison result. The second semiconductor device is configured to control the second interruption circuit so as to block the driving signal to be supplied to the motor in a case where the first voltage monitoring result is different from the first expected value or the second voltage monitoring result is different from the second expected value.

A functional safety system according to another embodiment includes: a first power source apparatus configured to generate a first power source voltage on a basis of an external power source and apply the first power source voltage to a first power source wiring; a first power source monitoring apparatus connected to the first power source wiring, the first power source monitoring apparatus being configured to monitor an electrical potential of the first power source wiring; and a first semiconductor device connected to the first power source wiring, the first semiconductor device being configured to operate on a basis of the first power source voltage. Further, the functional safety system also includes: a second power source apparatus configured to generate a second power source voltage on a basis of the external power source to apply the second power source voltage to a second power source wiring; a second power source monitoring apparatus connected to the second power source wiring, the second power source monitoring apparatus being configured to monitor an electrical potential of the second power source wiring; and a second semiconductor device connected to the second power source wiring, the second semiconductor device being configured to operate on a basis of the second power source voltage. Moreover, the functional safety system also includes: a first interruption circuit controlled by the first semiconductor device; a second interruption circuit controlled by the second semiconductor device; and a motor configured to receive a driving signal via the first interruption circuit and the second interruption circuit to operate on a basis of the driving signal. The first power source monitoring apparatus includes a first voltage converting circuit, a second voltage converting circuit, a first comparator circuit, and a second comparator circuit. The second semiconductor device has a first expected value and a second expected value. The first voltage converting circuit is configured to generate a first detected voltage from the first power source voltage on a basis of a first switching signal supplied from the second semiconductor device, and apply the first detected voltage to the first comparator circuit. The second voltage converting circuit is configured to generate a second detected voltage from the first power source voltage on a basis of the first switching signal, and apply the second detected voltage to the second comparator circuit. The first comparator circuit is configured to compare the first detected voltage with a first reference voltage, and supply a first voltage monitoring result to the second semiconductor device in accordance with a comparison result. The second comparator circuit is configured to compare the second detected voltage with the first reference voltage, and supply a second voltage monitoring result to the second semiconductor device in accordance with a comparison result. The second semiconductor device is configured to control the second interruption circuit so as to block the driving signal to be supplied to the motor in a case where the first voltage monitoring result is different from the first expected value or the second voltage monitoring result is different from the second expected value.

A functional safety system according to still another embodiment includes: a first power source apparatus configured to generate a first power source voltage on a basis of an external power source; a power source monitoring apparatus configured to receive the first power source voltage, and monitor the first power source voltage; and a first semiconductor device configured to receive the first power source voltage to operate on a basis of the first power source voltage. Further, the functional safety system also includes: a second power source apparatus configured to generate a second power source voltage on a basis of the external power source; and a second semiconductor device configured to receive the second power source voltage to operate on a basis of the second power source voltage. Moreover, the functional safety system also includes: an interruption circuit controlled by the second semiconductor device; and a motor configured to receive a driving signal via the interruption circuit to operate on a basis of the driving signal. The power source monitoring apparatus includes a voltage converting circuit and a comparator circuit. The second semiconductor device has a first value and a second value as an expected value. The voltage converting circuit is configured to generate a first divided voltage from the first power source voltage on a basis of a switching signal with a Low level, which is supplied from the second semiconductor device, and apply the first divided voltage to the comparator circuit. The voltage converting circuit is configured to generate a second divided voltage from the first power source voltage on a basis of the switching signal with a High level, and apply the second divided voltage to the comparator circuit. The comparator circuit is configured to compare the first divided voltage with a reference voltage to supply a first result value to the second semiconductor device on a basis of a comparison result thereof. The comparator circuit is further configured to compare the first divided voltage with the reference voltage to supply a second result value to the second semiconductor device on a basis of a comparison result thereof. The second semiconductor device is configured to control the interruption circuit so as to block the driving signal to be supplied to the motor in a case where the first result value is different from the first value or the second result value is different from the second value.

According to the embodiments, it is possible to provide a functional safety system with high reliability.

BRIEF DESCRIPTION OF THE DRAWINGS

FIG. 7 is a block diagram for explaining a configuration example of a power source monitoring apparatus according to the second embodiment;

DETAILED DESCRIPTION

Figure 1:
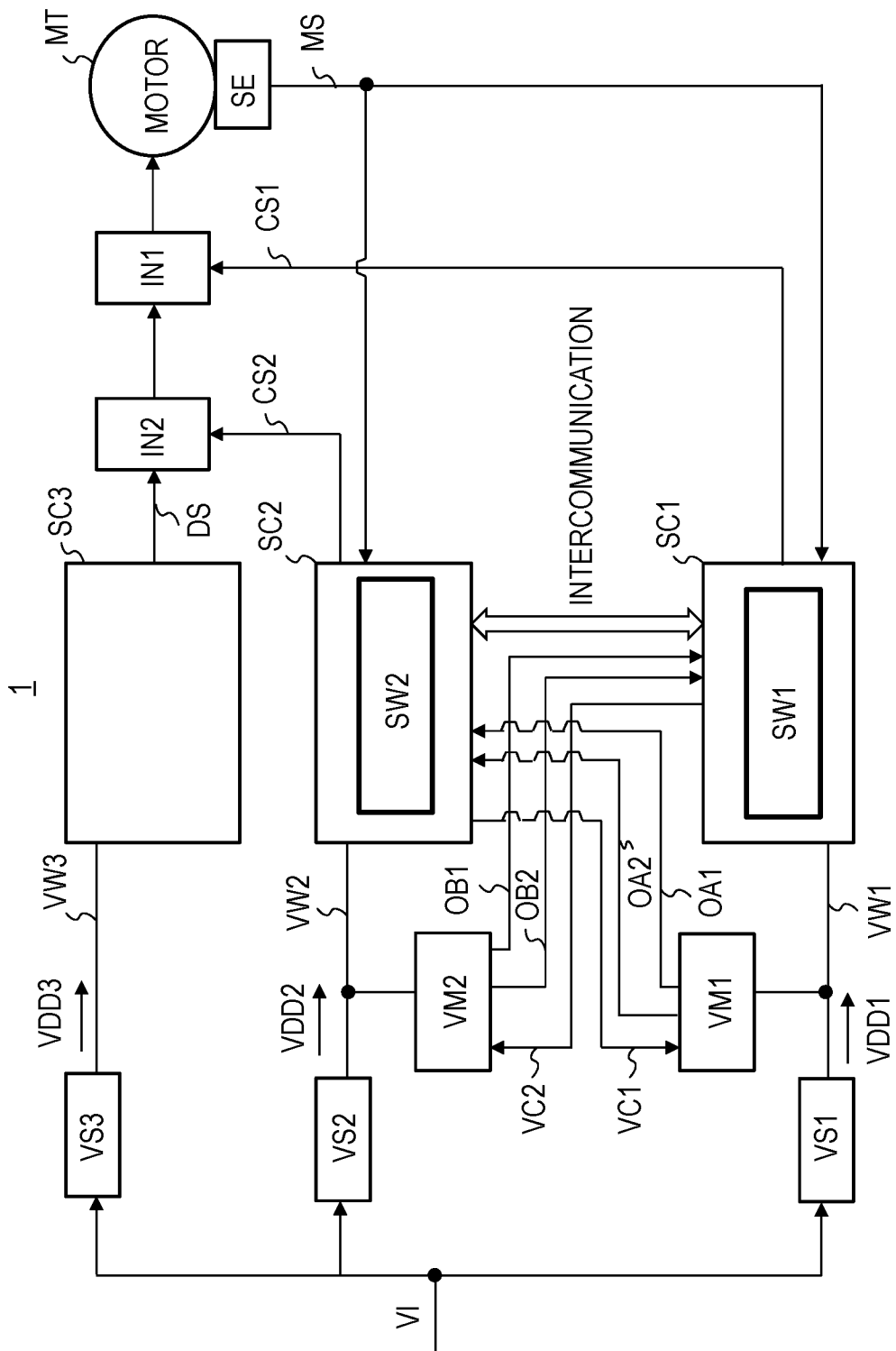
FIG. 1 is a block diagram for explaining a configuration example of a functional safety system according to a first embodiment.

In the following embodiments, when required for convenience, the description will be made by dividing into a plurality of sections or embodiments, but except when specifically stated, they are not independent from each other, and one is related to the modified example, some or all of the other, applications, detailed description, supplementary description, and the like. Further, in the following embodiments, the number of elements, including the number of constituent elements, numerical values, quantities, ranges etc., is not limited to the specific number, but may be not less than or equal to the specific number, except for cases where the number is specifically indicated and is clearly limited to the specific number in principle.

Moreover, in the following embodiments, the constituent elements (including the operation steps and the like) are not necessarily essential except in a case where they are specifically specified and the case where they are considered to be obviously essential in principle. Similarly, in the following embodiments, when referring to the shapes, positional relationships, and the like of components and the like, it is assumed that the shapes and the like are substantially similar to the shapes and the like, except for the case in which they are specifically specified and the case in which they are considered to be obvious in principle, and the like.

Further, the respective elements described in the drawings as functional blocks for performing various processes can be realized by a CPU (Central Processing Unit), a memory, and other circuits in terms of hardware, and are realized by programs loaded in the memory in terms of software. Therefore, it is understood by those skilled in the art that these functional blocks can be realized in various forms by hardware alone, software alone, or a combination thereof, and the present invention is not limited to any of them. In the drawings, the same elements are denoted by the same reference numerals, and a repetitive description thereof is omitted as necessary.

First Embodiment

FIG. 1 is a block diagram for explaining a configuration example of a functional safety system 1 according to a first embodiment.

The functional safety system 1 includes a motor MT, an angular sensor SE, a semiconductor device (as a first semiconductor device) SC1, a semiconductor device (as a second semiconductor device) SC2, a semiconductor device (as a third semiconductor device) SC3, an interruption circuit (as a first interruption circuit) IN1, an interruption circuit (as a second interruption circuit) IN2, a power source apparatus (as a first power source apparatus) VS1, a power source apparatus (as a second power source apparatus) VS2, a power source apparatus (as a third power source apparatus) VS3, a power source monitoring apparatus (as a first power source monitoring apparatus) VM1, a power source monitoring apparatus (as a second power source monitoring apparatus) VM2, a power source wiring (as a first power source wiring) VW1, a power source wiring (as a second power source wiring) VW2, and a power source wiring (as a third power source wiring) VW3. Further, the functional safety system 1 constitutes a functional safety system for the motor MT, which is a control target, by using the semiconductor devices SC1 and SC2.

The semiconductor devices SC1, SC2, and SC3, the interruption circuits IN1 and IN2, the power source apparatuses VS1, VS2, and VS3, the power source monitoring apparatuses VM1 and VM2 are formed on separate semiconductor chips. However, the interruption circuits IN1 and IN2 may be formed on one semiconductor chip. Further, the power source apparatuses VS1 and VS2 may also be formed on one semiconductor chip.

Each of the semiconductor devices SC1 and SC2 is an MCU (Micro Controller Unit) that detects abnormality of a monitoring target (for example, the motor MT, the power source apparatuses VS1 and VS2, the power source wiring VW1 and VW2, the power source monitoring apparatuses VM1 and VM2, or the like) and executes a safety control to safely stop the motor MT. Preferably, the semiconductor devices SC1 and SC2 have the same structure as each other. On the other hand, the semiconductor device SC3 is an MCU that drive the motor MT.

In the functional safety system 1, an operation power source voltage generated by a different power source apparatus is applied to each of the semiconductor devices SC1, SC2, and SC3. Specifically, the power source apparatus VS1 is configured to raise or step down an external power source voltage VI applied from the outside to generate a power source voltage (that is, a first power source voltage) VDD1. The power source apparatus VS1 applies the power source voltage VDD1 to the power source wiring VW1. The power source apparatus VS1 is connected to each of the power source monitoring apparatus VM1 and the semiconductor device SC1 via the power source wiring VW1, and applies the power source voltage VDD1 to the power source monitoring apparatus VM1 and the semiconductor device SC1 via the power source wiring VW1. The power source voltage VDD1 is an operation power source voltage for the semiconductor device SC1. The power source voltage VDD1 is 3.3 V, for example.

The power source apparatus VS2 is configured to raise or step down the external power source voltage VI to generate a power source voltage (as a second power source voltage) VDD2. The power source apparatus VS2 applies the power source voltage VDD2 to the power source wiring VW2. The power source apparatus VS2 is connected to each of the power source monitoring apparatus VM2 and the semiconductor device SC2 via the power source wiring VW2, and applies the power source voltage VDD2 to the power source monitoring apparatus VM2 and the semiconductor device SC2 via the power source wiring VW2. The power source voltage VDD2 is an operation power source voltage for the semiconductor device SC2. The power source voltage VDD2 is 3.3 V, for example.

The power source apparatus VS3 is configured to raise or step down the external power source voltage VI to generate a power source voltage VDD3 (that is, a third power source voltage). The power source apparatus VS3 applies the power source voltage VDD3 to the power source wiring VW3. The power source apparatus VS3 is connected to the semiconductor device SC3 via the power source wiring VW3, and applies the power source voltage VDD3 to the semiconductor device SC3 via the power source wiring VW3. The power source voltage VDD3 is an operation power source voltage for the semiconductor device SC3. The power source voltage VDD3 is 5 V, for example.

The power source monitoring apparatus VM1 receives the power source voltage VDD1 applied from the power source apparatus VS1 to the semiconductor device SC1, and monitors a value of the power source voltage VDD1. Specifically, the power source monitoring apparatus VM1 monitors an electrical potential of the power source wiring VW1 based on the power source voltage VDD1, and supplies output signals OA1 and OA2 to the semiconductor device SC2 as a voltage monitoring result. Namely, in a case where the value of the power source voltage VDD1 is abnormal, the power source monitoring apparatus VM1 notifies the semiconductor device SC2 that the value of the power source voltage VDD1 is abnormal as the output signals OA1 and OA2. Further, the power source monitoring apparatus VM1 can receive a switching signal (as a first switching signal) VC1 from the semiconductor device SC2, and can change a potential level of each of the output signals OA1 and OA2 on the basis of the switching signal VC1.

The power source monitoring apparatus VM2 receives, from the power source apparatus VS2, the power source voltage VDD2 to be applied to the semiconductor device SC2, and monitors a value of the power source voltage VDD2. Specifically, the power source monitoring apparatus VM2 monitors an electrical potential of the power source wiring VW2 based on the power source voltage VDD2, and supplies output signals OB1 and OB2 to the semiconductor device SC2 as a voltage monitoring result. Namely, in a case where the value of the power source voltage VDD2 is abnormal, the power source monitoring apparatus VM2 notifies the semiconductor device SC1 that the value of the power source voltage VDD2 is abnormal as the output signals OB1 and OB2. Further, the power source monitoring apparatus VM2 can receive a switching signal (as a second switching signal) VC2 from the semiconductor device SC1, and can change a potential level of each of the output signals OB1 and OB2 on the basis of the switching signal VC2.

The semiconductor device SC3 receives the power source voltage VDD3 to operate on the basis of the power source voltage VDD3. The semiconductor device SC3 outputs a driving signal DS for controlling driving of the motor MT. The driving signal DS is supplied to the motor MT via the interruption circuits IN1 and IN2.

The interruption circuit IN1 is connected to each of the interruption circuit IN2, the motor MT, and the semiconductor device SC1. Further, the interruption circuit IN1 is arranged between the interruption circuit IN2 and the motor MT. The interruption circuit IN1 is controlled on the basis of a control signal CS1 supplied from the semiconductor device SC1. Specifically, the interruption circuit IN1 blocks the driving signal DS, which is supplied to the motor MT from the semiconductor device SC3 via the interruption circuit IN2, on the basis of the control signal CS1 (for example, the control signal CS1 with a Low level). As a result, the motor MT cannot receive the driving signal DS, whereby a motion of the motor MT stops. On the other hand, the interruption circuit IN1 supplies the driving signal DS described above to the motor MT on the basis of the control signal CS1 (for example, the control signal CS1 with a High level).

The interruption circuit IN2 is connected to each of the semiconductor device SC3, the interruption circuit IN1, and the semiconductor device SC2. The interruption circuit IN2 is arranged between the interruption circuit IN1 and the semiconductor device SC3. The interruption circuit IN2 is controlled on the basis of a control signal CS2 supplied from the semiconductor device SC2. Specifically, the interruption circuit IN2 blocks the driving signal DS supplied from the semiconductor device SC3 to the motor MT on the basis of the control signal CS2 (for example, the control signal CS2 with a Low level). As a result, the motor MT cannot receive the driving signal DS, whereby the motion of the motor MT stops. On the other hand, the interruption circuit IN2 supplies the driving signal DS described above to the interruption circuit IN1 on the basis of the control signal CS2 (for example, the control signal CS2 with a High level).

The motor MT receives the driving signal DS from the semiconductor device SC3 via the interruption circuits IN1 and IN2, and is driven in accordance with the driving signal DS. Specifically, the motor MT carries out a rotational motion on the basis of the driving signal DS. The motor MT is a synchronous motor with three phases (a u phase, a v phase, and a w phase) (in other words, a brushless DC motor), for example. FIG. 1 illustrates the motor MT as the control target, but the present invention is not limited to this. For example, the control target may be an element that executes input and output of a signal, such as a sensor.

The angular sensor SE is connected to the motor MT. The angular sensor SE detects a rotation angle of the motor MT at a predetermined cycle, and supplies an information signal MS indicating information on the rotation angle of the motor MT to the semiconductor devices SC1 and SC2.

The semiconductor device SC1 receives the power source voltage VDD1 to operate on the basis of the power source voltage VDD1. The semiconductor device SC1 at least has safety control software SW1, an expected value (as a third expected value) E1, and an expected value (as a fourth expected value) E2. The semiconductor device SC1 executes the safety control software SW1. Therefore, the semiconductor device SC1 obtains the information signal MS supplied from the angular sensor SE to determine whether the motor MT is abnormal or normal. In a case where the semiconductor device SC1 detects abnormality of the motor MT, the semiconductor device SC1 supplies the control signal CS1 (for example, the control signal CS1 with the Low level) to the interruption circuit IN1. As a result, the interruption circuit IN1 blocks the driving signal DS, whereby the motion of the motor MT stops.

Moreover, the semiconductor device SC1 receives the output signals OB1 and OB2 to determine whether the value of the power source voltage VDD2 applied to the semiconductor device SC2 is abnormal or normal. In other words, the semiconductor device SC1 detects, on the basis of the output signals OB1 and OB2, whether any of the power source apparatus VS2, the power source monitoring apparatus VM2, or the power source wiring VM2 breaks down or not. In a case where the value of the power source voltage VDD2 is abnormal, the semiconductor device SC1 supplies the control signal CS1 (for example, the control signal CS1 with the Low level) to the interruption circuit IN1. Specifically, the semiconductor device SC1 compares a voltage monitoring result (that is, the output signal OB1) with an expected value E1 on the basis of the safety control software SW1, and further compares a voltage monitoring result (that is, the output signal OB2) with an expected value E2. In a case where the voltage monitoring result (that is, the output signal OB1) is different from the expected value E1 or the voltage monitoring result (that is, the output signal OB2) is different from the expected value E2, the semiconductor device SC1 supplies the control signal CS1 (for example, the control signal CS1 with the Low level) to the interruption circuit IN1. Accordingly, the interruption circuit IN1 blocks the driving signal DS. As a result, the motion of the motor MT stops.

Further, the semiconductor device SC1 supplies the switching signal VC2 to the power source monitoring apparatus VM2 on the basis of the safety control software SW1.

The semiconductor device SC2 receives the power source voltage VDD2 to operate on the basis of the power source voltage VDD2. The semiconductor device SC2 at least has safety control software SW2, an expected value (as a first expected value) E3, and an expected value (as a second expected value) E4. The semiconductor device SC2 executes the safety control software SW2. Therefore, the semiconductor device SC2 obtains the information signal MS supplied from the angular sensor SE, and determines whether the motor MT is abnormal or normal. In a case where the semiconductor device SC2 detects abnormality of the motor MT, the semiconductor device SC2 supplies the control signal CS2 (for example, the control signal CS2 with the Low level) to the interruption circuit IN2. As a result, the interruption circuit IN2 blocks the driving signal DS, whereby the motion of the motor MT stops.

Moreover, the semiconductor device SC2 receives the output signals OA1 and OA2 to determine whether the value of the power source voltage VDD1 applied to the semiconductor device SC1 is abnormal or normal. In other words, the semiconductor device SC2 detects, on the basis of the output signals OA1 and OA2, whether any of the power source apparatus VS1, the power source monitoring apparatus VM1, or the power source wiring VM1 breaks down or not. In a case where the value of the power source voltage VDD1 is abnormal, the semiconductor device SC2 supplies the control signal CS2 (for example, the control signal CS2 with the Low level) to the interruption circuit IN2. Specifically, the semiconductor device SC2 compares the voltage monitoring result (the output signal OA1) with the expected value E3 on the basis of the safety control software SW2, and further compares the voltage monitoring result (the output signal OA2) with the expected value E4. In a case where the voltage monitoring result (the output signal OA1) is different from the expected value E3 or the voltage monitoring result (the output signal OA2) is different from the expected value E4, the semiconductor device SC2 supplies the control signal CS2 (for example, the control signal CS2 with the Low level) to the interruption circuit IN2. Accordingly, the interruption circuit IN2 blocks the driving signal DS. As a result, the motion of the motor MT stops.

Further, the semiconductor device SC2 supplies the switching signal VC1 to the power source monitoring apparatus VM1 on the basis of the safety control software SW2.

Further, the semiconductor devices SC1 and SC2 execute intercommunication with each other at regular intervals. In the intercommunication, the semiconductor devices SC1 and SC2 can transmit and receive calculation result data and data in the middle of calculation with each other, and detect a breakdown of the other by comparing these data. Namely, the semiconductor devices SC1 and SC2 execute the intercommunication, thereby monitoring the operation of the other with each other. This makes it possible to secure functional safety of the system.

Figure 2:
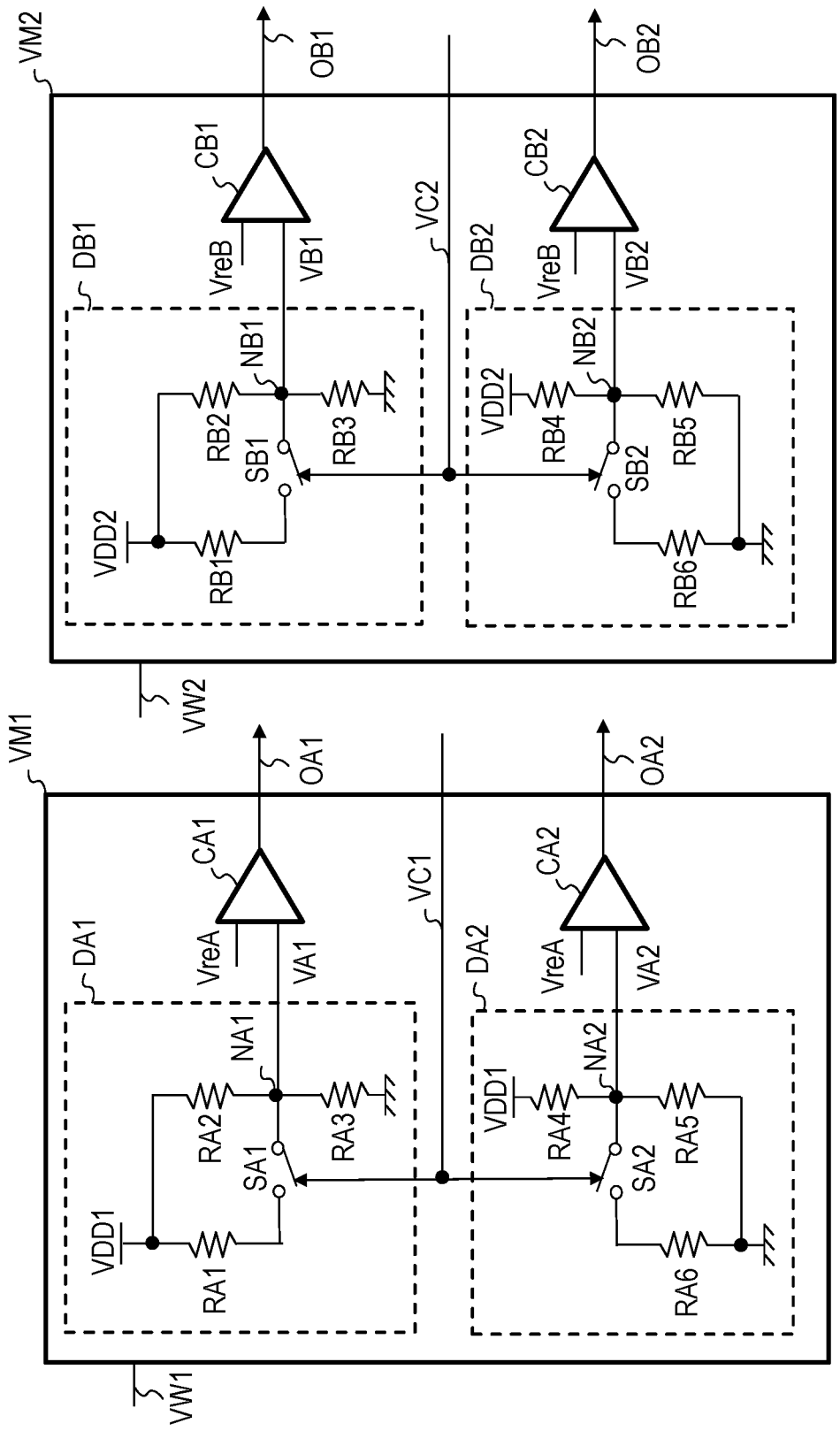
FIG. 2 is a block diagram for explaining a configuration example of a power source monitoring apparatus according to the first embodiment.

FIG. 2 is a block diagram for explaining a configuration example of the power source monitoring apparatuses VM1 and VM2 according to the first embodiment.

As illustrated in FIG. 2, the power source monitoring apparatus VM1 includes a voltage converting circuit (as a first voltage converting circuit) DA1, a voltage converting circuit (as a second voltage converting circuit) DA2, a comparator circuit (as a first comparator circuit) CA1, and a comparator circuit (as a second comparator circuit) CA2. The power source monitoring apparatus VM2 includes a voltage converting circuit (as a third voltage converting circuit) DB1, a voltage converting circuit (as a fourth voltage converting circuit) DB2, a comparator circuit (as a third comparator circuit) CB1, and a comparator circuit (as a fourth comparator circuit) CB2.

The voltage converting circuit DA1 includes a resistor (as a first resistor) RA1, a resistor (as a second resistor) RA2, a resistor (as a third resistor) RA3, and a switch (as a first switch) SA1. The voltage converting circuit DA2 includes a resistor (as a fourth resistor) RA4, a resistor (as a fifth resistor) RA5, a resistor (as a sixth resistor) RA6, and a switch (as a second switch) SA2. Each of the voltage converting circuits DA1 and DA2 is a resistance voltage dividing circuit. Further, a voltage node to which the power source voltage VDD1 is applied is connected to the power source wiring VW1.

The voltage converting circuit DA1 generates a detected voltage (as a first detected voltage) VA1 from the power source voltage VDD1 on the basis of the switching signal VC1, and applies the detected voltage VA1 from a voltage node (as a first detected voltage node) NA1 to the comparator circuit CA1. Further, the detected voltage VA1 varies on the basis of a potential level of the switching signal VC1. Namely, the detected voltage VA1 includes a detected voltage (as a first divided voltage) VNA1 and a detected voltage (as a second divided voltage) VNA2.

The resistor RA1 is connected to the voltage node to which the power source voltage VDD1 is applied. Further, the resistor RA2 is connected to a voltage node of the power source voltage VDD1 in parallel to the resistor RA1. The resistor RA2 is arranged between (and connected to) the voltage node to which the power source voltage VDD1 is applied and the voltage node NA1. The resistor RA3 is connected to the resistor RA2 in series via the voltage node NA1. The resistor RA3 is arranged between (and connected to) the voltage node NA1 and a ground voltage node. Moreover, the resistor RA1 is connected to the voltage node NA1 via the switch SA1. In other words, the switch SA1 is arranged between (and connected to) the resistor RA1 and the voltage node NA1. Further, the switch SA1 is set to any of ON/OFF states in accordance with the switching signal VC1. For example, the switch SA1 is set to the OFF state on the basis of the switching signal VC1 with a Low level, and is set to the ON state on the basis of the switching signal VC1 with a High level.

As illustrated in FIG. 2, in a case where the switch SA1 is in the OFF state, the voltage converting circuit DA1 uses the resistor RA2 and the resistor RA3 to divide the power source voltage VDD1. Accordingly, the voltage converting circuit DA1 applies the detected voltage VA1 obtained by dividing the power source voltage VDD1 to the comparator circuit CA1 via the detected voltage VNA1. Namely, in a case where the switching signal VC1 is in the Low level, the voltage converting circuit DA1 applies the detected voltage VNA1 to the comparator circuit CA1.

On the other hand, in a case where the switch SA1 is in the ON state, the voltage converting circuit DA1 divides the power source voltage VDD1 by using a parallel resistor combining the resistor RA1 and the resistor RA2 and the resistor RA3. Accordingly, the voltage converting circuit DA1 applies the detected voltage VA1 obtained by dividing the power source voltage VDD1 to the comparator circuit CA1 as the detected voltage VNA2. Namely, in a case where the switching signal VC1 is in the High level, the voltage converting circuit DA1 applies the detected voltage VNA2 to the comparator circuit CA1.

Therefore, a value of the detected voltage VNA1 is lower than a value of the detected voltage VNA2. In other words, the value of the detected voltage VA1 when the switching signal VC1 is in the Low level is lower than the value of the detected voltage VA1 when the switching signal VC1 is in the High level.

The comparator circuit CA1 compares the detected voltage VA1 (for example, VNA1 or VNA2) with a reference voltage (as a first reference voltage) VreA, and supplies the voltage monitoring result (the first voltage monitoring result) to the semiconductor device SC2 as the output signal OA1. In a case where the detected voltage VA1 (for example, VNA1 or VNA2) is higher than the reference voltage VreA, the comparator circuit CA1 outputs the output signal OA1 with a High level. On the other hand, in a case where the detected voltage VA1 (for example, VNA1 or VNA2) is lower than the reference voltage VreA, the comparator circuit CA1 outputs the output signal OA1 with a Low level. Further, although it will be described later, the first voltage monitoring result includes a first result value and a second result value.

One input terminal of the comparator circuit CA1 is connected to the voltage node NA1 to receive the detected voltage VA1. The other input terminal of the comparator circuit CA1 is connected to a reference voltage generating circuit, which is not illustrated in FIG. 2, to receive the reference voltage VreA from the reference voltage generating circuit. In a case where the switching signal VC1 is in the Low level, the comparator circuit CA1 compares the detected voltage VNA1 with the reference voltage VreA, and supplies its voltage monitoring result (the first result value) to the semiconductor device SC2 as the output signal OA1. In a case where the switching signal VC1 is in the High level, the comparator circuit CA1 compares the detected voltage VNA2 with the reference voltage VreA, and supplies its voltage monitoring result (the second result value) to the semiconductor device SC2 as the output signal OA1. The voltage monitoring result described above is a comparison result by the comparator circuit CA1.

The voltage converting circuit DA2 generates a detected voltage (as a second detected voltage) VA2 from the power source voltage VDD1 on the basis of the switching signal VC1, and applies the detected voltage VA2 from a voltage node (as a second detected voltage node) NA2 to the comparator circuit CA2. Further, the detected voltage VA2 varies on the basis of the potential level of the switching signal VC1. Namely, the detected voltage VA2 includes a detected voltage (as a third divided voltage) VNA3 and a detected voltage (as a fourth divided voltage) VNA4.

The resistor RA4 is connected to a voltage node to which the power source voltage VDD1 is applied. Further, the resistor RA4 is arranged between (and connected to) the voltage node to which the power source voltage VDD1 is applied and the voltage node NA2. The resistor RA5 is connected to the resistor RA4 in series via the voltage node NA2. The resistor RA5 is connected the ground voltage node, and is arranged between (and connected to) the voltage node NA2 and the ground voltage node. The resistor RA6 is connected to the ground voltage node in parallel to the resistor RA5. The resistor RA6 is connected to the voltage node NA2 via the switch SA2. In other words, the switch SA2 is arranged between (and connected to) the resistor RA6 and the voltage node NA2. Further, the switch SA2 is set to any of ON/OFF states in accordance with the switching signal VC1. For example, the switch SA2 is set to the OFF state on the basis of the switching signal VC1 with the Low level, and is set to the ON state on the basis of the switching signal VC1 with the High level.

As illustrated in FIG. 2, in a case where the switch SA2 is in the OFF state, the voltage converting circuit DA2 divides the power source voltage VDD1 by using the resistor RA4 and the resistor RA5. Accordingly, the voltage converting circuit DA2 applies the detected voltage VA2 obtained by dividing the power source voltage VDD1 to the comparator circuit CA2 as the detected voltage VNA3. Namely, in a case where the switching signal VC1 is in the Low level, the voltage converting circuit DA2 applies the detected voltage VNA3 to the comparator circuit CA2.

On the other hand, in a case where the switch SA2 is in the ON state, the voltage converting circuit DA2 divides the power source voltage VDD1 by using a parallel resistor combining the resistor RA5 and the resistor RA6 and the resistor RA4. Accordingly, the voltage converting circuit DA2 applies the detected voltage VA2 obtained by dividing the power source voltage VDD1 to the comparator circuit CA2 as the detected voltage VNA4. Namely, in a case where the switching signal VC1 is in the Low level, the voltage converting circuit DA2 applies the detected voltage VNA4 to the comparator circuit CA2.

Therefore, a value of the detected voltage VNA4 is lower than a value of the detected voltage VNA3. In other words, the value of the detected voltage VA2 when the switching signal VC1 is in the High level is lower than the value of the detected voltage VA2 when the switching signal VC1 is in the Low level.

The comparator circuit CA2 compares the detected voltage VA2 (for example, VNA3 or VNA4) with the reference voltage (as the first reference voltage) VreA, and supplies a voltage monitoring result (as a second voltage monitoring result) to the semiconductor device SC2 via the output signal OA2. For example, in a case where the detected voltage VA2 (for example, VNA3 or VNA4) is higher than the reference voltage VreA, the comparator circuit CA2 outputs the output signal OA2 with the High level. On the other hand, in a case where the detected voltage VA2 (for example, VNA3 or VNA4) is lower than the reference voltage VreA, the comparator circuit CA2 outputs the output signal OA2 with the Low level. Further, it will be described later, but the second voltage monitoring result includes a third result value and a fourth result value.

One input terminal of the comparator circuit CA2 is connected to the voltage node NA2 to receive the detected voltage VA2. The other input terminal of the comparator circuit CA2 receives the reference voltage VreA from the reference voltage generating circuit described above. In a case where the switching signal VC1 is in the Low level, the comparator circuit CA2 compares the detected voltage VNA3 with the reference voltage VreA, and supplies its voltage monitoring result (the third result value) to the semiconductor device SC2 as the output signal OA2. Similarly, in a case where the switching signal VC1 is in the High level, the comparator circuit CA2 compares the detected voltage VNA4 with the reference voltage VreA, and supplies its voltage monitoring result (the fourth result value) to the semiconductor device SC2 as the output signal OA2. The voltage monitoring result described above is a comparison result by the comparator circuit CA2.

The voltage converting circuit DB1 includes a resistor RB1, a resistor RB2, a resistor RB3, and a switch SB1. The voltage converting circuit DB2 includes a resistor RB4, a resistor RB5, a resistor RB6, and a switch SB2. Each of the voltage converting circuits DB1 and DB2 is a resistance voltage dividing circuit. Further, a voltage node to which the power source voltage VDD2 is applied is connected to the power source wiring VW2.

The voltage converting circuit DB1 generates a detected voltage (as a third detected voltage) VB1 from the power source voltage VDD2 on the basis of the switching signal VC2, and applies the detected voltage VB1 from a voltage node (as a third detected voltage node) NB1 to the comparator circuit CB1. Further, the detected voltage VB1 varies on the basis of a potential level of the switching signal VC2. Namely, the detected voltage VB1 includes a detected voltage (as a fifth divided voltage) VNB1 and a detected voltage (as a sixth divided voltage) VNB2. Since a circuit configuration of the voltage converting circuit DB1 is the same as a circuit configuration of the voltage converting circuit DA1, concrete explanation thereof is omitted. Namely, the voltage node to which the power source voltage VDD2 is applied corresponds to the voltage node to which the power source voltage VDD1 is applied. The resistor RB1 corresponds to the resistor RA1. The resistor RB2 corresponds to the resistor RA2. The resistor RB3 corresponds to the resistor RA3. The switch SB1 corresponds to the switch SA1. Further, the voltage node NB1 corresponds to the voltage node NA1. However, the switch SB1 is not set to any of ON/OFF states in accordance with the switching signal VC1, but is set to any of the ON/OFF states in accordance with the switching signal VC2. For example, the switch SB1 is set to the OFF state on the basis of the switching signal VC2 with a Low level, and is set to the ON state on the basis of the switching signal VC2 with a High level.

As illustrated in FIG. 2, in a case where the switch SB1 is in the OFF state, the voltage converting circuit DB1 divides the power source voltage VDD2 by using the resistor RB2 and the resistor RB3. Accordingly, the voltage converting circuit DB1 applies the detected voltage VB1 obtained by dividing the power source voltage VDD2 to the comparator circuit CB1 as the detected voltage VNB1. Namely, in a case where the switching signal VC2 is in the Low level, the voltage converting circuit DB1 applies the detected voltage VNB1 to the comparator circuit CB1.

On the other hand, in a case where the switch SB1 is in the ON state, the voltage converting circuit DB1 divides the power source voltage VDD2 by using a parallel resistor combining the resistor RB1 and the resistor RB2 and the resistor RB3. Accordingly, the voltage converting circuit DB1 applies the detected voltage VB1 obtained by dividing the power source voltage VDD2 to the comparator circuit CB1 as the detected voltage VNB2. Namely, in a case where the switching signal VC2 is in the High level, the voltage converting circuit DB1 applies the detected voltage VNB2 to the comparator circuit CB1.

Therefore, a value of the detected voltage VNB1 is lower than a value of the detected voltage VNB2. In other words, a value of the detected voltage VB1 when the switching signal VC2 is in the Low level is lower than the value of the detected voltage VB1 when the switching signal VC2 is in the High level.

The comparator circuit CB1 compares the detected voltage VB1 (for example, VNB1 or VNB2) with a reference voltage (as a second reference voltage) VreB, and supplies a voltage monitoring result (as a third voltage monitoring result) to the semiconductor device SC1 as the output signal OB1. For example, in a case where the detected voltage VB1 (VNB1 or VNB2) is higher than the reference voltage VreA, the comparator circuit CB1 outputs the output signal OB1 with a High level. On the other hand, in a case where the detected voltage VB1 (for example, VNB1 or VNB2) is lower than the reference voltage VreB, the comparator circuit CB1 outputs the output signal OB1 with a Low level. Further, it will be described later, but the third voltage monitoring result includes a fifth result value and a sixth result value.

One input terminal of the comparator circuit CB1 is connected to the voltage node NB1 to receive the detected voltage VB1. The other input terminal of the comparator circuit CB1 is connected to a reference voltage generating circuit, which is not illustrated in FIG. 2, and receives the reference voltage VreB from the reference voltage generating circuit. In a case where the switching signal VC2 is in the Low level, the comparator circuit CB1 compares the detected voltage VNB1 with the reference voltage VreB, and supplies its voltage monitoring result (the fifth result value) to the semiconductor device SC1 as the output signal OB1. Similarly, in a case where the switching signal VC2 is in the High level, the comparator circuit CB1 compares the detected voltage VNB2 with the reference voltage VreB, and supplies its voltage monitoring result (the sixth result value) to the semiconductor device SC1 as the output signal OB1. The voltage monitoring result described above is a comparison result by the comparator circuit CB1.

The voltage converting circuit DB2 generates a detected voltage (as a fourth detected voltage) VB2 from the power source voltage VDD2 on the basis of the switching signal VC2, and applies the detected voltage VB2 to the comparator circuit CB2 from a voltage node (as a fourth detected voltage node) NB2. Further, the detected voltage VA2 varies on the basis of the potential level of the switching signal VC2. Namely, the detected voltage VB2 includes a detected voltage (as a seventh divided voltage) VNB3 and a detected voltage (as an eighth divided voltage) VNB4. Further, since a circuit configuration of the voltage converting circuit DB2 is the same as a circuit configuration of the voltage converting circuit DA2, concrete explanation thereof is omitted. Namely, the voltage node to which the power source voltage VDD2 is applied corresponds to the voltage node to which the power source voltage VDD1 is applied. The resistor RB4 corresponds to the resistor RA4. The resistor RB5 corresponds to the resistor RA5. The resistor RB6 corresponds to the resistor RA6. The switch SB2 corresponds to, the switch SA2. Further, the voltage node NB2 corresponds to the voltage node NA2. However, the switch SB2 is not set to any of ON/OFF states in accordance with the switching signal VC1, but is set to any of the ON/OFF state in accordance with the switching signal VC2. For example, the switch SB2 is set to the OFF state on the basis of the switching signal VC2 with the Low level, and is set to the ON state on the basis of the switching signal VC2 with the High level.

As illustrated in FIG. 2, in a case where the switch SB2 is in the OFF state, the voltage converting circuit DB2 divides the power source voltage VDD2 by using the resistor RB4 and the resistor RB5. Accordingly, the voltage converting circuit DB2 applies the detected voltage VB2 obtained by dividing the power source voltage VDD2 to the comparator circuit CB2 as the detected voltage VNB3. Namely, in a case where the switching signal VC2 is in the Low level, the voltage converting circuit DB2 applies the detected voltage VNB3 to the comparator circuit CB2.

On the other hand, in a case where the switch SB2 is in the ON state, the voltage converting circuit DB2 divides the power source voltage VDD2 by using a parallel resistor combining the resistor RB5 and the resistor RB6 and the resistor RB4. Accordingly, the voltage converting circuit DB2 applies the detected voltage VB2 obtained by dividing the power source voltage VDD2 to the comparator circuit CB2 as the detected voltage VNB4. Namely, in a case where the switching signal VC2 is in the High level, the voltage converting circuit DB2 applies the detected voltage VNB4 to the comparator circuit CB2.

Therefore, a value of the detected voltage VNB4 is lower than a value of the detected voltage VNB3. In other words, a value of the detected voltage VB2 when the switching signal VC2 is in the High level is lower than the value of the detected voltage VB2 when the switching signal VC2 is in the Low level.

The comparator circuit CB2 compares the detected voltage VB2 (for example, VNB3 or VNB4) with the reference voltage (as the second reference voltage) VreB, and supplies a voltage monitoring result (as a fourth voltage monitoring result) to the semiconductor device SC1 as the output signal OB2. For example, in a case where the detected voltage VB2 (for example, VNB3 or VNB4) is higher than the reference voltage VreB, the comparator circuit CB2 outputs the output signal OB2 with a High level. On the other hand, in a case where the detected voltage VB2 (for example, VNB3 or VNB4) is lower than the reference voltage VreB, the comparator circuit CB2 outputs the output signal OB2 with a Low level. Further, it will be described later, but the fourth voltage monitoring result includes a seventh result value and an eighth result value.

One input terminal of the comparator circuit CB2 is connected to the voltage node NB2 to receive the detected voltage VB2. The other input terminal of the comparator circuit CB2 receives the reference voltage VreB from the reference voltage generating circuit described above. In a case where the switching signal VC2 is in the Low level, the comparator circuit CB2 compares the detected voltage VNB3 with the reference voltage VreB, and supplies its voltage monitoring result (as the seventh result value) to the semiconductor device SC1 as the output signal OB2. Similarly, in a case where the switching signal VC2 is in the High level, the comparator circuit CB2 compares the detected voltage VNB4 with the reference voltage VreB, and supplies its voltage monitoring result (as the eighth result value) to the semiconductor device SC1 as the output signal OB2. The voltage monitoring result described above is a comparison result by the comparator circuit CB2.

Further, in a case where the value of the power source voltage VDD1 is constant, the value of the detected voltage VNA1 is lower than a value of the detected voltage VNA3, and the value of the detected voltage VNA4 is lower than the value of the detected voltage VNA2. In a case where the value of the power source voltage VDD2 is constant, the value of the detected voltage VNB1 is lower than the value of the detected voltage VNB3, and the value of the detected voltage VNB4 is lower than the value of the detected voltage VNB2. A value of each resistor in each of the voltage converting circuits DA1, DA2, DB1, and DB2 is designed so as to become the relationship described above.

Figure 3:
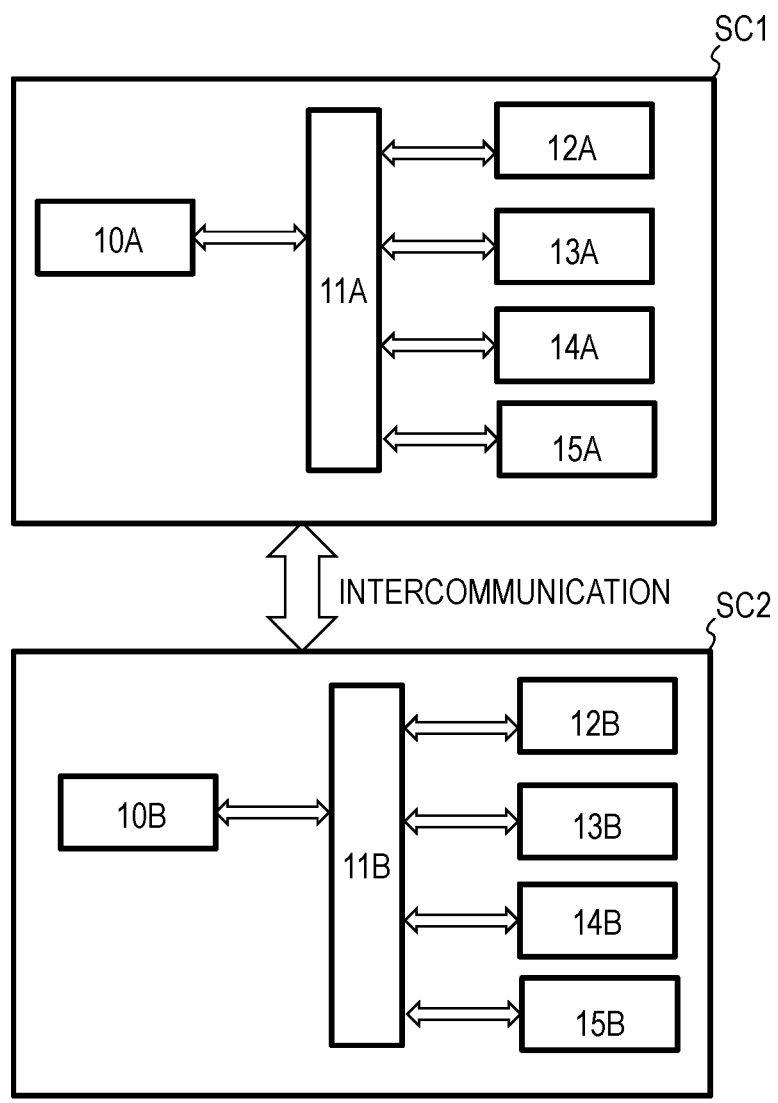
FIG. 3 is a block diagram for explaining a configuration example of a semiconductor device according to the first embodiment.

FIG. 3 is a block diagram for explaining a configuration example of the semiconductor devices SC1 and SC2 according to the first embodiment.

As illustrated in FIG. 3, the semiconductor device SC1 includes an operation unit 10A, a bus 11A, a ROM (Read Only Memory) 12A, a RAM (Random Access Memory) 13A, a timer 14A, and a communication interface 15A. The semiconductor device SC2 includes an operation unit 10B, a bus 11B, ROM (Read Only Memory) 12B, a RAM (Random Access Memory) 13B, a timer 14B, and a communication interface 15B. In order to construct a dual functional safety system, it is desirable that each circuit of the semiconductor device SC1 is the same as each circuit of the semiconductor device SC2 with each other.

The bus 11A connects the operation unit 10A and a group of peripheral circuits (for example, the ROM 12A, the RAM 13A, the timer 14A, and the communication interface 15A) to each other.

The safety control software SW1, the expected value E1, and the expected value E2 are stored in the ROM 12A. The expected value E1 includes an expected value (as a fifth value) E1L corresponding to the switching signal VC2 with the Low level and an expected value (as a sixth value) E1H corresponding to the switching signal VC2 with the High level. The expected value E1L is a value of the Low level, and the expected value E1H is a value of the High level. The expected value E2 includes an expected value (as a seventh value) E2L corresponding to the switching signal VC2 with the Low level and an expected value (as an eighth value) E2H corresponding to the switching signal VC2 with the High level. The expected value E2L is a value of the High level, and the expected value E2H is a value of the Low level. Specifically, in a case where the switching signal VC2 is in the Low level, the expected value E1L is the output signal OB1 with the Low level, and the expected value E2L is the output signal OB2 with the High level. In a case where the switching signal VC2 is in the High level, the expected value E1H is the output signal OB1 with the High level, and the expected value E2H is the output signal OB2 with the Low level.

Data that are temporarily used when the safety control software SW1 is executed are stored in the RAM 13A.

When a count value reaches a value set in advance, the timer 14A supplies an interruption signal to the operation unit 10A. For that reason, the timer 14A can supply the interruption signal to the operation unit 10A at regular intervals.

The operation unit 10A reads out the safety control software SW1 from the ROM 12A and executes the safety control software SW1. The operation unit 10A executes the safety control software SW1, and changes the potential level of the switching signal VC2 on the basis of the timer 14A. Specifically, the operation unit 10A changes the potential level of the switching signal VC2 between the Low level and the High level at regular intervals on the basis of the interruption signal supplied from the timer 14A.

Moreover, the operation unit 10A executes the safety control software SW1, and reads out the expected value E1 containing the expected values E1L and E1H and the expected value E2 containing the expected values E2L and E2H from the ROM 12A. When the switching signal VC2 is in the Low level, the operation unit 10A compares the output signal OB1 when the switching signal VC2 is in the Low level with the expected value E1L on the basis of the safety control software SW1. Similarly, the operation unit 10A compares the output signal OB2 when the switching signal VC2 is in the Low level with the expected value E2L. As a result, in a case where the output signal OB1 described above is different from the expected value E1L or the output signal OB2 described above is different from the expected value E2L, the operation unit 10A supplies the control signal CS1 (for example, the control signal CS1 with the Low level) to the interruption circuit IN1. Moreover, when the switching signal VC2 is in the High level, the operation unit 10A compares the output signal OB1 when the switching signal VC2 is in the High level with the expected value E1H on the basis of the safety control software SW1. Similarly, the operation unit 10A compares the output signal OB2 when the switching signal VC2 is in the High level with the expected value E2H. As a result, in a case where the output signal OB1 described above is different from the expected value E1H or the output signal OB2 described above is different from the expected value E2H, the operation unit 10A supplies the control signal CS1 (for example, the control signal CS1 with the Low level) to the interruption circuit IN1. Accordingly, the interruption circuit IN1 blocks the driving signal DS, whereby a driving operation of the motor MT stops.

The communication interface 15A executes intercommunication with the semiconductor device SC2. Specifically, the operation unit 10A executes intercommunication with the semiconductor device SC2 via the communication interface 15A at regular intervals on the basis of the interruption signal supplied from the timer 14A. Timing when the intercommunication is executed is the same as timing when the potential level of the switching signal VC2 is changed because they are executed on the basis of the common interruption signal from the timer 14A.

In the semiconductor device SC2, the bus 11B connects the operation unit 10B and a group of peripheral circuits (for example, the ROM 12B, the RAM 13B, the timer 14B, and the communication interface 15B) to each other.

The safety control software SW2, the expected value E3, and the expected value E4 are stored in the ROM 12B. The expected value E3 includes an expected value (as a first value) E3L corresponding to the switching signal VC1 with the Low level and an expected value (as a second value) E3H corresponding to the switching signal VC1 with the High level. The expected value E3L is a value of the Low level, and the expected value E3H is a value of the High level. The expected value E4 includes an expected value (as a third value) E4L corresponding to the switching signal VC1 with the Low level and an expected value (as a fourth value) E4H corresponding to the switching signal VC1 with the High level. The expected value E4L is a value of the High level, and the expected value E4H is a value of the Low level. Specifically, in a case where the switching signal VC1 is in the Low level, the expected value E3L is the output signal OA1 with the Low level, and the expected value E4L is the output signal OA2 with the High level. In a case where the switching signal VC1 is in the High level, the expected value E3H is the output signal OA1 with the High level, and the expected value E4H is the output signal OA2 with the Low level.

Data that are temporarily used when the safety control software SW2 is executed are stored in the RAM 13B.

When a count value reaches a value set in advance, the timer 14B supplies an interruption signal to the operation unit 10B. For that reason, the timer 14B can supply the interruption signal to the operation unit 10B at regular intervals.

The operation unit 10B reads out the safety control software SW2 from the ROM 12B, and executes the safety control software SW2. The operation unit 10B executes the safety control software SW2, and changes the potential level of the switching signal VC1 on the basis of the timer 14B. The operation unit 10B changes the potential level of the switching signal VC1 between the Low level and the High level at regular intervals on the basis of the interruption signal supplied from the timer 14B.

Moreover, the operation unit 10B executes the safety control software SW2, and reads out the expected value E3 containing the expected values E3L and E3H and the expected value E4 containing the expected values E4L and E4H from the ROM 12B. When the switching signal VC1 is in the Low level, the operation unit 10B compares the output signal OA1 when the switching signal VC1 is in the Low level with the expected value E3L on the basis of the safety control software SW2. Similarly, the operation unit 10B compares the output signal OA2 when the switching signal VC1 is in the Low level with the expected value E4L. As a result, in a case where the output signal OA1 described above is different from the expected value E3L or the output signal OA2 described above is different from the expected value E4L, the operation unit 10B supplies the control signal CS2 (for example, the control signal CS2 with the Low level) to the interruption circuit IN2. Moreover, when the switching signal VC1 is in the High level, the operation unit 10B compares the output signal OA1 when the switching signal VC1 is in the High level with the expected value E3H on the basis of the safety control software SW2. Similarly, the operation unit 10B compares the output signal OA2 when the switching signal VC1 is in the High level with the expected value E4H. As a result, in a case where the output signal OA1 described above is different from the expected value E3H or the output signal OA2 described above is different from the expected value E4H, the operation unit 10B supplies the control signal CS2 (for example, the control signal CS2 with the Low level) to the interruption circuit IN2. Accordingly, the interruption circuit IN2 blocks the driving signal DS, and the driving operation of the motor MT stops.

The communication interface 15B executes intercommunication with the semiconductor device SC1. Specifically, the operation unit 10B executes intercommunication with the semiconductor device SC1 via the communication interface 15B at regular intervals on the basis of the interruption signal supplied from the timer 14B. Timing when the intercommunication is executed is the same as timing when the potential level of the switching signal VC1 is changed because they are executed on the basis of the common interruption signal from the timer 14B.

Figure 4:
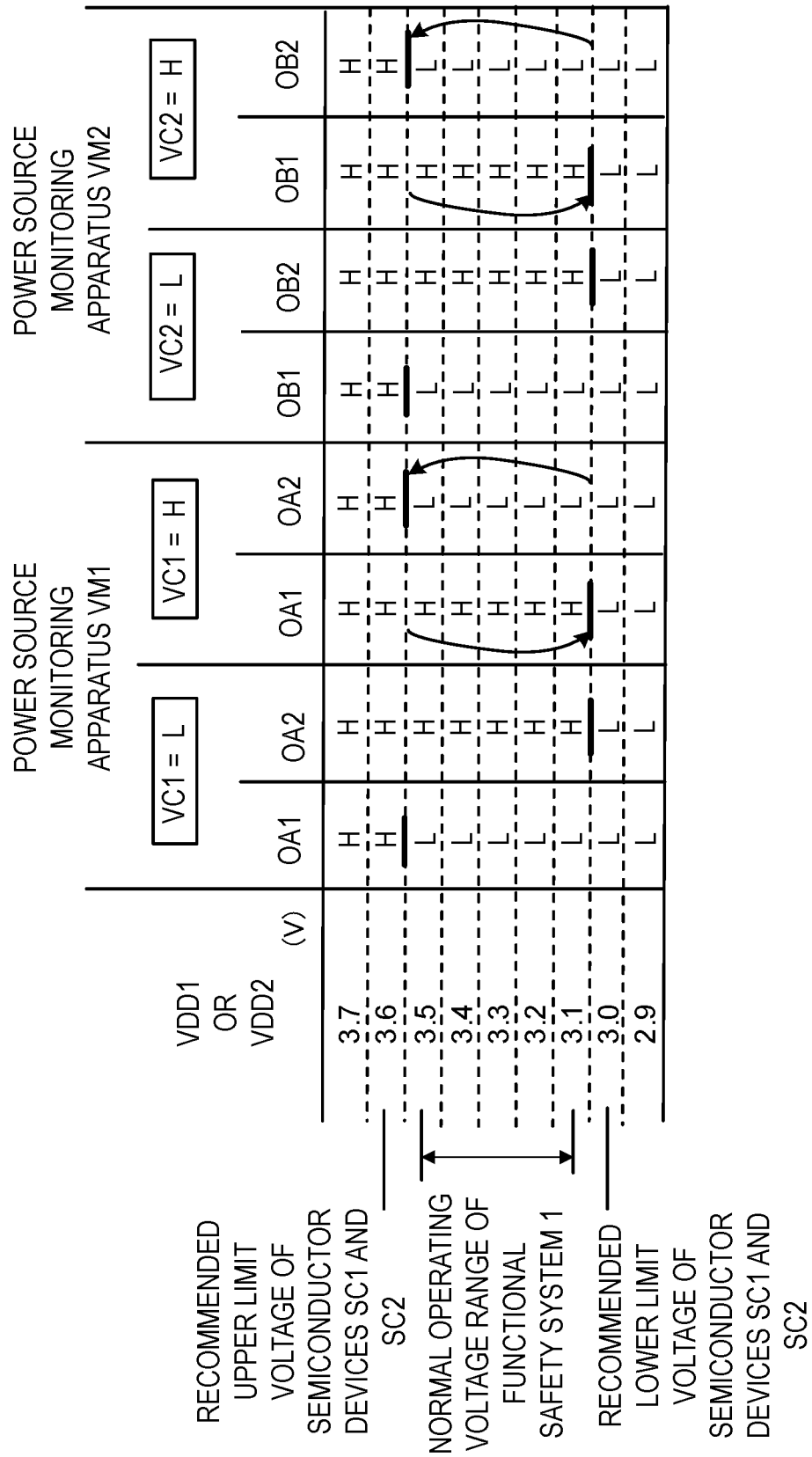
FIG. 4 is a view for explaining an example of an output result of the power source monitoring apparatus according to the first embodiment.

FIG. 4 is a view for explaining an example of an output result of the power source monitoring apparatuses VM1 and VM2 according to the first embodiment. The potential levels of the output signals OA1, OA2, OB1, and OB2 are described in FIG. 4 as output results (the voltage monitoring results) of the power source monitoring apparatuses VM1 and VM2. In FIG. 4, a mark "H" indicates an electrical potential of the High level, and a mark "L" indicates an electrical potential of the Low level.

As illustrated in FIG. 4, a recommended upper limit voltage of the semiconductor devices SC1 and SC2 is 3.6 V, for example, and a recommended lower limit voltage of the semiconductor devices SC1 and SC2 is 3.0 V, for example. Accordingly, it is preferable that a normal operating voltage range for the functional safety system 1 falls within a range from the recommended lower limit voltage to the recommended upper limit voltage of the semiconductor devices SC1 and SC2. For that reason, as illustrated in FIG. 4, the normal operating voltage range for the functional safety system 1 is from 3.5 V to 3.1 V.

In the present embodiment, the power source apparatuses VS1 and VS2 are designed in advance so that each of the power source voltages VDD1 and VDD2 falls within the operating voltage range described above. Further, in the power source monitoring apparatus VM1, in view of the operating voltage range described above, the potential level of each of the output signals OA1 and OA2 is designed in advance so as to vary as the potential level illustrated in FIG. 4. A case where the switching signal VC1 is in the Low level will first be described below. In a case where the power source voltage VDD1 is equal to or lower than 3.5 V, the output signal OA1 with the Low level is outputted. On the other hand, in a case where the power source voltage VDD1 is higher than 3.5 V, the output signal OA1 with the High level is outputted. Next, a case where the switching signal VC1 is in the High level will be described below. In a case where the power source voltage VDD1 is equal to or higher than 3.1 V, the output signal OA1 with the High level is outputted. On the other hand, in a case where the power source voltage VDD1 is lower than 3.1 V, the output signal OA1 with the Low level is outputted. Therefore, by causing the switching signal VC1 to transition from the Low level to the High level, it is possible to lower the voltage value for the monitoring target.

Further, a case where the switching signal VC1 is in the Low level will be described below. In a case where the power source voltage VDD1 is equal to or higher than 3.1 V, the output signal OA2 with the High level is outputted. On the other hand, in a case where the power source voltage VDD1 is lower than 3.1 V, the output signal OA2 with the Low level is outputted. Next, a case where the switching signal VC1 is in the High level will be described below. In a case where the power source voltage VDD1 is equal to or lower than 3.5 V, the output signal OA2 with the Low level is outputted. On the other hand, in a case where the power source voltage VDD1 is higher than 3.5 V, the output signal OA2 with the High level is outputted. Therefore, by causing the switching signal VC1 to transition from the Low level to the High level, it is possible to raise the voltage value for the monitoring target. In order to design the power source monitoring apparatus VM1, it is necessary to calculate a resistor value of each of the resistor RA1, RA2, RA3, RA4, RA5, and RA6 and a value of the reference voltage VreA so as to become the configuration described above.

Further, since the power source monitoring apparatus VM2 has the similar structure to that of the power source monitoring apparatus VM1, explanation regarding the potential levels of the output signals OB1 and OB2 is omitted. Namely, the output signal OB1 corresponds to the output signal OA1, and the output signal OB2 corresponds to the output signal OA2. Moreover, the switching signal VC2 corresponds to the switching signal VC1.

Figure 5:
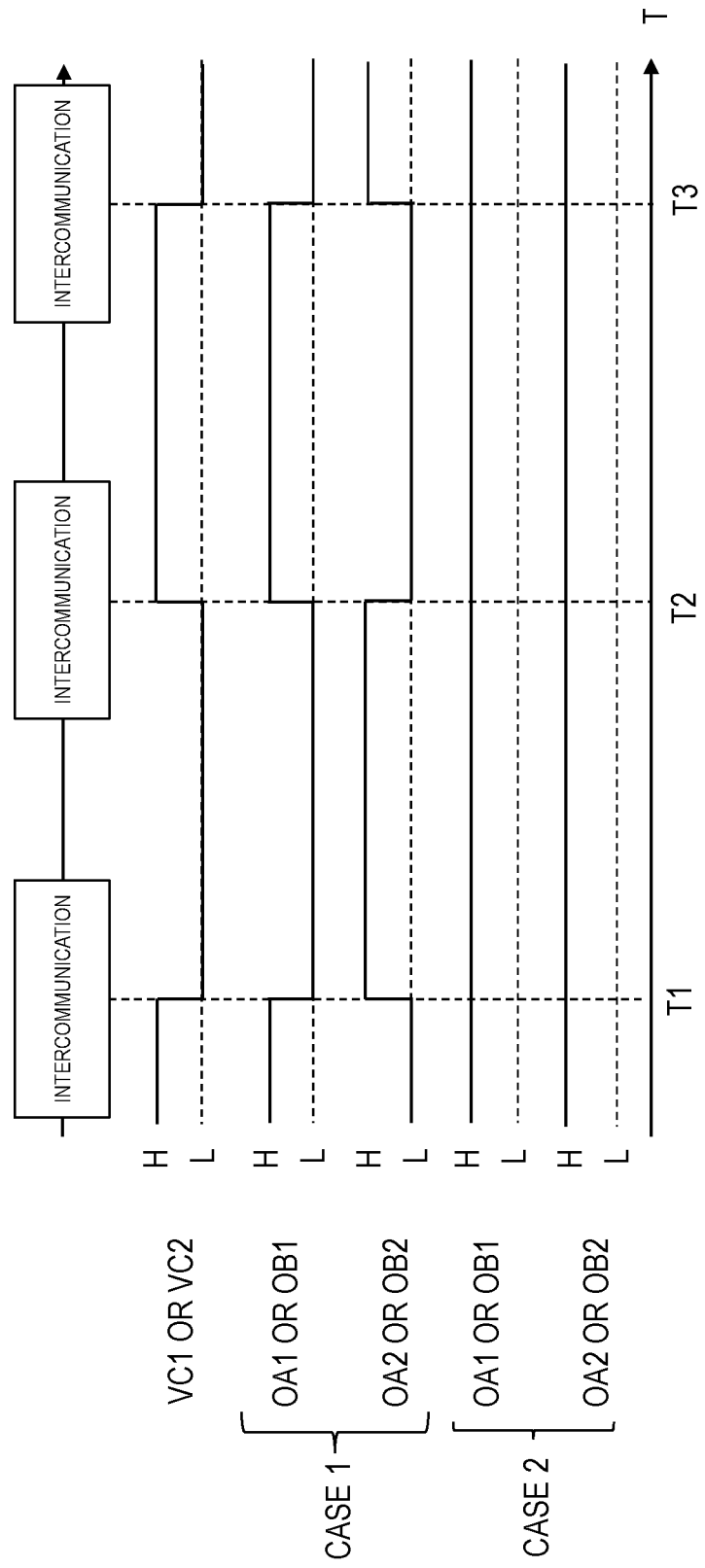
FIG. 5 is a view for explaining an operation of the power source monitoring apparatus according to the first embodiment.

FIG. 5 is a view for explaining an operation of each of the power source monitoring apparatuses VM1 and VM2 according to the first embodiment. FIG. 5 illustrates Case 1 and Case 2 as the operations of the power source monitoring apparatuses VM1 and VM2 based on FIG. 4. Further, in FIG. 5, a mark "H" indicates an electrical potential of the High level, and a mark "L" indicates an electrical potential of the Low level. Moreover, the values that have been explained above are respectively set to the expected values E1, E2, E3, and E4.

In FIG. 5, timing of the intercommunication is the same as timing when the potential level of the switching signal VC1 or VC2 varies. Specifically, at times T1 and T3, the intercommunication is executed when the switching signal VC1 or VC2 transitions from the High level to the Low level. At a time T2, the intercommunication is executed when the switching signal VC1 or VC2 transitions from the Low level to the High level.

Case 1 is an example of a case where the value of the power source voltage VDD1 or VDD2 falls within the normal operating voltage range for the functional safety system 1. On the basis of FIG. 4, for example, a value of the power source voltage VDD1 or VDD2 is 3.3 V.

Operations of the power source monitoring apparatus VM1 in case of Case 1 and the semiconductor device SC2 will be described below. The switching signal VC1 transitions from the High level to the Low level at the time T1. As a result, each of the switch SA1 and SA2 is set to the OFF state. Accordingly, the voltage converting circuit DA1 generates the detected voltage VNA1 from the power source voltage VDD1, and the voltage converting circuit DA2 generates the detected voltage VNA3 from the power source voltage VDD1. The comparator circuit CA1 compares the detected voltage VNA1 with the reference voltage VreA, and outputs the output signal OA1 with the Low level to the semiconductor device SC2 in accordance with its comparison result. The comparator circuit CA2 compares the detected voltage VNA3 with the reference voltage VreA, and outputs the output signal OA2 with the High level to the semiconductor device SC2 in accordance with its comparison result. Further, as described above, the detected voltage VNA1 is a value lower than the detected voltage VNA3 at the time T1. For this reason, the voltage converting circuit DA1 monitors whether the power source voltage VDD1 is lower than an upper limit voltage of the normal operating voltage range for the functional safety system 1 or not. On the other hand, the detected voltage VNA3 is a value higher than the detected voltage VNA1. For this reason, the voltage converting circuit DA2 monitors whether the power source voltage VDD1 is higher than a lower limit voltage of the normal operating voltage range for the functional safety system 1 or not. Therefore, at the time T1, the power source monitoring apparatus VM1 can monitor whether the power source voltage VDD1 falls within the normal operating voltage range for the functional safety system 1 or not.

At the time T1, the semiconductor device SC2 receives the output signal OA1 with the Low level and the output signal OA2 with the High level as a voltage monitoring result of the power source monitoring apparatus VM1. Accordingly, the semiconductor device SC2 compares the voltage monitoring result (the output signal OA1 with the Low level) with the expected value E3L on the basis of the safety control software SW2, and further compares the voltage monitoring result (the output signal OA2 with the High level) with the expected value E4L. The voltage monitoring result (the output signal OA1 with the Low level) is the same as the expected value E3L, and the voltage monitoring result (the output signal OA2 with the High level) is also the same as the expected value E4L. For this reason, the semiconductor device SC2 supplies the control signal CS2 with the High level to the interruption circuit IN2, for example.

Namely, at the time T1, the semiconductor device SC2 determines that the value of the power source voltage VDD1 falls within the operating voltage range for the functional safety system 1. In other words, the semiconductor device SC2 determines that any of the power source apparatus VS1, the power source wiring VW1, and the power source monitoring apparatus VM1 does not break down.

The interruption circuit IN2 does not block the driving signal DS on the basis of the control signal CS2 with the High level. For that reason, the motor MT continues to rotate.

The switching signal VC1 transitions from the Low level to the High level at the time T2. As a result, the switch SA1 and SA2 is set to the ON state. Accordingly, the voltage converting circuit DA1 generates the detected voltage VNA2 from the power source voltage VDD1, and the voltage converting circuit DA2 generates the detected voltage VNA4 from the power source voltage VDD1. The comparator circuit CA1 compares the detected voltage VNA2 with the reference voltage VreA, and outputs the output signal OA1 with the High level to the semiconductor device SC2 in accordance with its comparison result. The comparator circuit CA2 compares the detected voltage VNA4 with the reference voltage VreA, and outputs the output signal OA2 with the Low level to the semiconductor device SC2 in accordance with its comparison result. Further, as described above, the detected voltage VNA4 is a lower value than that of the detected voltage VNA2. For this reason, the voltage converting circuit DA2 monitors whether the power source voltage VDD1 is lower than the upper limit voltage of the normal operating voltage range for the functional safety system 1 or not. On the other hand, since the detected voltage VNA2 is a higher value than that of the detected voltage VNA4, the voltage converting circuit DA1 monitors whether the power source voltage VDD1 is higher than the lower limit voltage of the normal operating voltage range for the functional safety system 1 or not. Therefore, as well as the time T1 at the time T2, the power source monitoring apparatus VM1 can monitor whether the power source voltage VDD1 falls within the normal operating voltage range for the functional safety system 1 or not.

At the time T2, the semiconductor device SC2 receives the output signal OA1 with the High level and the output signal OA2 with the Low level as the voltage monitoring result of the power source monitoring apparatus VM1. Accordingly, the semiconductor device SC2 compares the voltage monitoring result (the output signal OA1 with the High level) with the expected value E3 on the basis of the safety control software SW2, and further compares the voltage monitoring result (the output signal OA2 with the Low level) with the expected value E4H. The voltage monitoring result (the output signal OA1 with the High level) is the same as the expected value E3H, and the voltage monitoring result (the output signal OA2 with the Low level) is the same as the expected value E4H. For this reason, as well as the above, the semiconductor device SC2 supplies the control signal CS2 with the High level to the interruption circuit IN2.

Namely, at the time T2, the semiconductor device SC2 determines that the value of the power source voltage VDD1 falls within the operating voltage range for the functional safety system 1. In other words, the semiconductor device SC2 determines that any of the power source apparatus VS1, the power source wiring VW1, and the power source monitoring apparatus VM1 does not break down. For that reason, as well as the above, the motor MT continues to rotate.

Further, as described above, the power source monitoring apparatus VM1 inverts the potential level of the output signal OA1 in accordance with inversion of the potential level of the switching signal VC1. For that reason, through the times T1 and T2, the power source monitoring apparatus VM1 can monitor whether the power source voltage VDD1 falls within the normal operating voltage range for the functional safety system 1 or not. Specifically, since the detected voltage VNA1 is a lower value than that of the detected voltage VNA2, each of the voltage converting circuit DA1 and the comparator circuit CA1 monitors whether the power source voltage VDD1 is lower than the upper limit voltage of the normal operating voltage range for the functional safety system 1 or not at the time T1. On the other hand, since the detected voltage VNA2 is a higher than that of the detected voltage VNA1, each of the voltage converting circuit DA1 and the comparator circuit CA1 monitors whether the power source voltage VDD1 is higher than the lower limit voltage of the normal operating voltage range for the functional safety system 1 or not at the time T2.

Further, as described above, the power source monitoring apparatus VM1 inverts the potential level of the output signal OA2 in accordance with inversion of the potential level of the switching signal VC1. For that reason, as well as the above, through the times T1 and T2, the power source monitoring apparatus VM1 can also monitor whether the power source voltage VDD1 falls within the normal operating voltage range for the functional safety system 1 or not. Specifically, the detected voltage VNA3 is a higher value than that of the detected voltage VNA4. Therefore, each of the voltage converting circuit DA2 and the comparator circuit CA2 monitors whether the power source voltage VDD1 is higher than the lower limit voltage of the normal operating voltage range for the functional safety system 1 or not at the time T1. On the other hand, since the detected voltage VNA4 is a lower value than that of the detected voltage VNA3, each of the voltage converting circuit DA2 and the comparator circuit CA2 monitors whether the power source voltage VDD1 is lower than the upper limit voltage of the normal operating voltage range for the functional safety system 1 or not at the time T2.

Operations of the power source monitoring apparatus VM2 and the semiconductor device SC1 in case of Case 1 will be described below. However, since the operation is the similar operation to the above, detailed description thereof is omitted. At the time T1, the voltage converting circuit DB1 generates the detected voltage VNB1 from the power source voltage VDD2, and the voltage converting circuit DB2 generates the detected voltage VNB3 from the power source voltage VDD2. At the time T1, the comparator circuit CB1 compares the detected voltage VNB1 with the reference voltage VreB, and outputs the output signal OB1 with the Low level to the semiconductor device SC1 in accordance with its comparison result. The comparator circuit CB2 compares the detected voltage VNB3 with the reference voltage VreB, and outputs the output signal OB2 with the High level to the semiconductor device SC1 in accordance with its comparison result. As well as the above, at the time T1, the voltage converting circuit DB1 monitors whether the power source voltage VDD2 is lower than the upper limit voltage of the normal operating voltage range for the functional safety system 1 or not. On the other hand, the voltage converting circuit DB2 monitors whether the power source voltage VDD1 is higher than the lower limit voltage of the normal operating voltage range for the functional safety system 1 or not. Therefore, at the time T1, the power source monitoring apparatus VM2 can monitor whether the power source voltage VDD2 falls within the normal operating voltage range for the functional safety system 1 or not.

At the time T1, the semiconductor device SC1 receives the output signal OB1 with the Low level and the output signal OB2 with the High level as a voltage monitoring result of the power source monitoring apparatus VM2. The semiconductor device SC1 compares the voltage monitoring result (the output signal OB1 with the Low level) with the expected value E1L on the basis of the safety control software SW1, and compares the voltage monitoring result (the output signal OB2 with the High level) with the expected value E2L. The voltage monitoring result (the output signal OB1 with the Low level) is the same as the expected value E1L, and the voltage monitoring result (the output signal OB2 with the High level) is the same as the expected value E2L. For this reason, the semiconductor device SC1 supplies the control signal CS1 with the High level to the interruption circuit IN1, for example.

Namely, at the time T1, the semiconductor device SC1 determines whether the value of the power source voltage VDD2 falls within the operating voltage range for the functional safety system 1 or not. In other words, the semiconductor device SC1 determines that any of the power source apparatus VS2, the power source wiring VW3, and a power source monitoring apparatus VM4 does not break down. For that reason, the interruption circuit IN1 does not block the driving signal DS on the basis of the control signal CS1 with the High level. As a result, the motor MT continues to rotate.

At the time T2, the voltage converting circuit DB1 generates the detected voltage VNB2 from the power source voltage VDD2, and the voltage converting circuit DB2 generates the detected voltage VNB4 from the power source voltage VDD2. At the time T2, the comparator circuit CB1 compares the detected voltage VNB2 with the reference voltage VreB, and outputs the output signal OB1 with the High level to the semiconductor device SC1 in accordance with its comparison result. The comparator circuit CB2 compares the detected voltage VNB4 with the reference voltage VreB, and outputs the output signal OB2 with the Low level to the semiconductor device SC1 in accordance with its comparison result. At the time T2, the voltage converting circuit DB2 monitors whether the power source voltage VDD2 is lower than the upper limit voltage of the normal operating voltage range for the functional safety system 1 or not. On the other hand, the voltage converting circuit DB1 monitors whether the power source voltage VDD1 is higher than the lower limit voltage of the normal operating voltage range for the functional safety system 1 or not. Therefore, at the time T2, the power source monitoring apparatus VM2 can monitor whether the power source voltage VDD2 falls within the normal operating voltage range for the functional safety system 1 or not.

At the time T2, the semiconductor device SC1 receives the output signal OB1 with the High level and the output signal OB2 with the Low level as the voltage monitoring result of the power source monitoring apparatus VM2. The semiconductor device SC1 compares the voltage monitoring result (the output signal OB1 with the High level) with the expected value E1H on the basis of the safety control software SW1, and compares the voltage monitoring result (the output signal OB2 with the Low level) with the expected value E2H. The voltage monitoring result (the output signal OB1 with the High level) is the same as the expected value E1H, and the voltage monitoring result (the output signal OB2 with the Low level) is the same as the expected value E2H. For this reason, the semiconductor device SC1 supplies the control signal CS1 (for example, the control signal CS1 with the High level) to the interruption circuit IN1.

Namely, at the time T2, the semiconductor device SC1 also determines that the value of the power source voltage VDD2 falls within the operating voltage range for the functional safety system 1. In other words, the semiconductor device SC1 determines that any of the power source apparatus VS2, the power source wiring VW2, and the power source monitoring apparatus VM2 does not break down. For that reason, as well as the above, the motor MT continues to rotate.

Further, as described above, the power source monitoring apparatus VM2 inverts the potential level of the output signal OB1 in accordance with inversion of the potential level of the switching signal VC2. For that reason, through the times T1 and T2, the power source monitoring apparatus VM2 can also monitor whether the power source voltage VDD2 falls within the normal operating voltage range for the functional safety system 1 or not. Specifically, the detected voltage VNB1 is a lower value than that of the detected voltage VNB2. For this reason, each of the voltage converting circuit DB1 and the comparator circuit CB1 monitors whether the power source voltage VDD2 is lower than the upper limit voltage of the normal operating voltage range for the functional safety system 1 or not at the time T1. On the other hand, the detected voltage VNB2 is a higher value than that of the detected voltage VNB1. For this reason, each of the voltage converting circuit DB1 and the comparator circuit CB1 monitors whether the power source voltage VDD2 is higher than the lower limit voltage of the normal operating voltage range for the functional safety system 1 or not at the time T2.

Further, as described above, the power source monitoring apparatus VM2 inverts the potential level of the output signal OB2 in accordance with inversion of the potential level of the switching signal VC2. For that reason, through the times T1 and T2, the power source monitoring apparatus VM2 can also monitor whether the power source voltage VDD2 falls within the normal operating voltage range for the functional safety system 1 or not. Specifically, the detected voltage VNB3 is a higher value than that of the detected voltage VNB4. For this reason, each of the voltage converting circuit DB2 and the comparator circuit CB2 monitors whether the power source voltage VDD2 is higher than the lower limit voltage of the normal operating voltage range for the functional safety system 1 or not at the time T1. On the other hand, the detected voltage VNB4 is a lower value than that of the detected voltage VNB3. For this reason, each of the voltage converting circuit DB2 and the comparator circuit CB2 monitors whether the power source voltage VDD2 is lower than the upper limit voltage of the normal operating voltage range for the functional safety system 1 or not at the time T2.

Case 2 is a case where the power source voltage VDD1 is higher than the normal operating voltage range for the functional safety system 1 due to a breakdown of the power source apparatus VS1 or the power source wiring VW1. Alternatively, Case 2 is a case where the power source voltage VDD2 is higher than the normal operating voltage range for the functional safety system 1 due to a breakdown of the power source apparatus VS2 or the power source wiring VW2. On the basis of FIG. 4, a value of the power source voltage VDD1 or VDD2 is 3.7 V, for example. In Case 2, since the semiconductor devices SC1 and SC2 cannot operate stably, there is a possibility that the functional safety system 1 may not operate stably. Therefore, the functional safety system 1 is required to block the driving signal DS and stop the motion of the motor MT.

Operations of the power source monitoring apparatus VM1 and the semiconductor device SC2 in case of Case 2 will be described below. At the time T1, the value of the power source voltage VDD1 in Case 2 is higher than the value of the power source voltage VDD1 in Case 1. Accordingly, the values of the detected voltage VNA1 and the detected voltage VNA3 in Case 2 are respectively different from the values of the detected voltage VNA1 and the detected voltage VNA3 in Case 1. For that reason, unlike the time T1 in Case 1, at the time T1 in Case 2, the comparator circuit CA1 compares the detected voltage VNA1 with the reference voltage VreA, and outputs the output signal OA1 with the High level to the semiconductor device SC2 in accordance with its comparison result. The comparator circuit CA2 compares the detected voltage VNA3 with the reference voltage VreA, and outputs the output signal OA2 with the High level to the semiconductor device SC2 in accordance with its comparison result.

In Case 2, at the time T1, the semiconductor device SC2 receives the output signals OA1 and OA2 with the High level as the voltage monitoring result of the power source monitoring apparatus VM1. Accordingly, as described above, the semiconductor device SC2 compares the voltage monitoring result (the output signal OA1 with the High level) with the expected value E3L on the basis of the safety control software SW2, and further compares the voltage monitoring result (the output signal OA2 with the High level) with the expected value E4L. Since the voltage monitoring result (the output signal OA1 with the High level) is at least different from the expected value E3L, the semiconductor device SC2 supplies the control signal CS2 (for example, the control signal CS2 with the Low level) to the interruption circuit IN2. The interruption circuit IN2 blocks the driving signal DS on the basis of the control signal CS2 with the Low level. As a result, a rotational motion of the motor MT is stopped.

Namely, at the time T1, the semiconductor device SC2 determines that the value of the power source voltage VDD1 is outside the operating voltage range for the functional safety system 1. In other words, the semiconductor device SC2 determines that the power source apparatus VS1 or the power source wiring VW1 breaks down. For that reason, the interruption circuit IN2 blocks the driving signal DS on the basis of the control signal CS2 with the Low level. As a result, the rotational motion of the motor MT is stopped. This makes it possible to secure safety of the functional safety system 1.

At the time T2, the value of the power source voltage VDD1 in Case 2 is higher than the value of the power source voltage VDD1 in Case 1. Accordingly, the values of the detected voltage VNA2 and the detected voltage VNA4 in Case 2 are respectively different from the values of the detected voltage VNA2 and the detected voltage VNA4 in Case 1. For that reason, unlike the time T2 in Case 1, at the time T2 in Case 2, the comparator circuit CA2 compares the detected voltage VNA4 with the reference voltage VreA, and outputs the output signal OA2 with the High level to the semiconductor device SC2 in accordance with its comparison result. The comparator circuit CA1 compares the detected voltage VNA2 with the reference voltage VreA, and outputs the output signal OA1 with the High level to the semiconductor device SC2 in accordance with its comparison result.

At the time T2, as well as the time T1, the semiconductor device SC2 receives the output signals OA1 and OA2 with the High level as the voltage monitoring result of the power source monitoring apparatus VM1. Accordingly, as described above, the semiconductor device SC2 compares the voltage monitoring result (the output signal OA1 with the High level) with the expected value E3H on the basis of the safety control software SW2, and further compares the voltage monitoring result (the output signal OA2 with the High level) with the expected value E4H. Since the voltage monitoring result (the output signal OA2 with the High level) is at least different from the expected value E4H, the semiconductor device SC2 supplies the control signal CS2 (for example, the control signal CS2 with the Low level) to the interruption circuit IN2.

Namely, at the time T2, the semiconductor device SC2 also determines that the value of the power source voltage VDD1 is outside the operating voltage range for the functional safety system 1. For that reason, as well as the above, it is possible to stop the rotational motion of the motor MT, and this makes it possible to secure safety of the functional safety system 1.

Operations of the power source monitoring apparatus VM2 and the semiconductor device SC1 in case of Case 2 are similar to the above. Therefore, detailed description thereof is omitted. The value of the power source voltage VDD2 in Case 2 is higher than the value of the power source voltage VDD2 in Case 1. Accordingly, the values of the detected voltage VNB1 and the detected voltage VNB3 in Case 2 are respectively different from the values of the detected voltage VNB1 and the detected voltage VNB3 in Case 1. Similarly, the values of the detected voltage VNB2 and the detected voltage VNB4 in Case 2 are respectively different from the values of the detected voltage VNB2 and the detected voltage VNB4 in Case 1.

For that reason, unlike the time T1 in Case 1, at the time T1 in Case 2, the comparator circuit CB1 compares the detected voltage VNB1 with the reference voltage VreB, and outputs the output signal OB1 with the High level to the semiconductor device SC1 in accordance with its comparison result. Accordingly, since the voltage monitoring result (the output signal OB1 with the High level) of the semiconductor device SC2 is at least different from the expected value E1L, the semiconductor device SC1 supplies the control signal CS1 (for example, the control signal CS1 with the Low level) to the interruption circuit IN1.

Further, unlike the time T2 in Case 1, at the time T2 in Case 2, the comparator circuit CB2 compares the detected voltage VNB4 with the reference voltage VreB, and outputs the output signal OB2 with the High level to the semiconductor device SC1 in accordance with its comparison result. Accordingly, since the voltage monitoring result (the output signal OB2 with the High level) of the semiconductor device SC2 is at least different from the expected value E2H, the semiconductor device SC1 supplies the control signal CS1 (for example, the control signal CS1 with the Low level) to the interruption circuit IN1.

Namely, at the times T1 and T2, the semiconductor device SC1 determines that the value of the power source voltage VDD2 is outside the operating voltage range for the functional safety system 1. In other words, the semiconductor device SC1 determines that any of the power source apparatus VS2 or the power source wiring VW2 breaks down. For that reason, the interruption circuit IN1 blocks the driving signal DS on the basis of the control signal CS1 with the Low level. As a result, the rotational motion of the motor MT is stopped. This makes it possible to secure safety of the functional safety system 1.

Further, although it is not illustrated in FIG. 5, the power source voltage VDD1 or VDD2 may be lower than the normal operating voltage range for the functional safety system 1 due to a breakdown of the power source apparatus VS1 or VS2 or the power source wiring VW1 or VW2. For example, the value of the power source voltage VDD1 or the value of the power source voltage VDD2 is 2.9 V. In such a case, it is also possible to stop the rotational motion of the motor MT, and this makes it possible to secure safety of the functional safety system 1. As illustrated in FIG. 4, in a case where the switching signal VC1 is in the Low level, the output signal OA2 is also in the Low level. For this reason, as described above, the semiconductor device SC2 blocks the driving signal DS. On the other hand, in a case where the switching signal VC1 is in the High level, the output signal OA1 is in the Low level. For this reason, as described above, the semiconductor device SC2 blocks the driving signal DS. Further, in a case where the switching signal VC2 is in the Low level, the output signal OB2 is also in the Low level. Therefore, as described above, the semiconductor device SC1 blocks the driving signal DS. On the other hand, in a case where the switching signal VC2 is in the High level, the output signal OB1 is in the Low level. For this reason, as described above, the semiconductor device SC1 blocks the driving signal DS.

Therefore, the semiconductor device SC1 can determine whether at least any of the power source apparatus VS2 and the power source wiring VW2 breaks down or not while the switching signal VC2 is in the Low level. Moreover, the semiconductor device SC1 can also determine whether at least any of the power source apparatus VS2 and the power source wiring VW2 breaks down or not while the switching signal VC2 is in the High level. For that reason, it is possible to provide the functional safety system 1 with high reliability.

Similarly, the semiconductor device SC2 can determine whether at least any of the power source apparatus VS1 and the power source wiring VW1 is abnormal or not while the switching signal VC1 is in the Low level. Moreover, the semiconductor device SC2 can also determine whether at least any of the power source apparatus VS1 and the power source wiring VW1 is abnormal or not while the switching signal VC1 is in the High level. For that reason, it is possible to provide the functional safety system 1 with high reliability.

Moreover, as described above, the power source monitoring apparatus VM1 changes the potential level of each of the output signals OA1 and OA2 in accordance with a change in the potential level of the switching signal VC1. For this reason, the semiconductor device SC2 can determine whether the power source monitoring apparatus VM1 itself operates normally or not. For example, the potential level of the output signal OA1 varies in accordance with the change in the potential level of the switching signal VC1. However, the potential level of the output signal OA2 may not be changed. In such a case, there is a probability that the power source monitoring apparatus VM1 breaks down. In such a case, as described above, the semiconductor device SC2 also blocks the driving signal DS. For that reason, it is possible to provide the functional safety system 1 with higher reliability.

Further, the power source monitoring apparatus VM2 changes the potential level of each of the output signals OB1 and OB2 in accordance with a change in the potential level of the switching signal VC2. For this reason, the semiconductor device SC1 can also determine whether the power source monitoring apparatus VM2 itself operates normally or not. For example, the potential level of the output signal OB1 varies in accordance with the change in the potential level of the switching signal VC2. However, the potential level of the output signal OB2 may not be changed. In such a case, there is a probability that the power source monitoring apparatus VM2 breaks down. In such a case, as described above, the semiconductor device SC1 also blocks the driving signal DS. For that reason, it is possible to provide the functional safety system 1 with higher reliability.

Further, the power source monitoring apparatus VM1 changes the potential level of each of the output signals OA1 and OA2 in accordance with the change in the potential level of the switching signal VC1. For this reason, the functional safety system 1 can determine whether any of the power source apparatus VS1, the power source wiring VW1, and the power source monitoring apparatus VM1 breaks down or not without changing the value of the power source voltage VDD1. Similarly, the power source monitoring apparatus VM2 changes the potential level of each of the output signals OB1 and OB2 in accordance with the change in the potential level of the switching signal VC2. For this reason, the functional safety system 1 can determine whether any of the power source apparatus VS2, the power source wiring VW2, and the power source monitoring apparatus VM2 breaks down or not without changing the value of the power source voltage VDD2. For that reason, the functional safety system 1 can detect the breakdown thereof during a normal operation thereof.

Further, in the functional safety system 1, there is a combination between the output signals OA1 and OA2 in case of Case 1 and the output signals OB1 and OB2 in case of Case 2. In such a case, as described above, the semiconductor device SC2 executes the normal operation, but the semiconductor device SC1 controls the interruption circuit IN1 so as to block supply of the driving signal DS. As a result, the rotational motion of the motor MT is stopped. For that reason, the functional safety system 1 can construct a dual functional safety system using the semiconductor devices SC1 and SC2.

Second Embodiment

Figure 6:
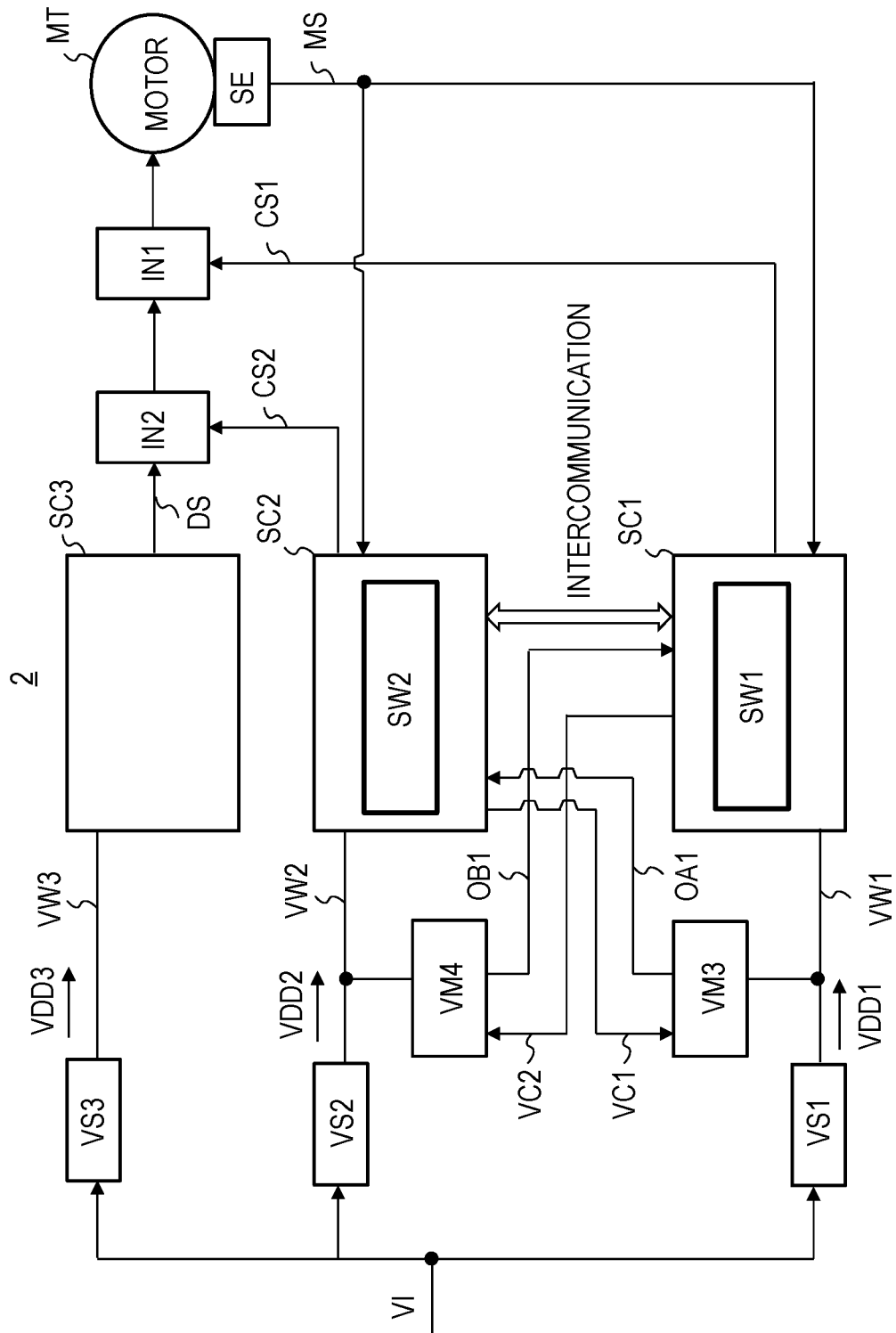
FIG. 6 is a block diagram for explaining a configuration example of a functional safety system according to a second embodiment.

FIG. 6 is a block diagram for explaining a configuration example of a functional safety system 2 according to a second embodiment.

The functional safety system 2 includes a power source monitoring apparatus (as a first power source monitoring apparatus) VM3 in place of the power source monitoring apparatus VM1 of the functional safety system 1. The power source monitoring apparatus VM3 is different from the power source monitoring apparatus VM1, and does not supplies an output signal OA2 to a semiconductor device SC2. Further, the functional safety system 2 includes a power source monitoring apparatus (as a second power source monitoring apparatus) VM4 in place of the power source monitoring apparatus VM2 of the functional safety system 1. The power source monitoring apparatus VM4 is different from the power source monitoring apparatus VM2, and does not supplies an output signal OB2 to a semiconductor device SC1.

In the functional safety system 2, a configuration other than the power source monitoring apparatuses VM3 and VM4 is similar to that of the functional safety system 1. Therefore, the same reference numeral is assigned to each of the same components, and explanation thereof is omitted. However, the semiconductor device SC1 according to the second embodiment is different from the semiconductor device SC1 according to the first embodiment, and does not include an expected value E2. Further, the semiconductor device SC2 according to the second embodiment is different from the semiconductor device SC2 according to the first embodiment, and does not includes an expected value E4.

FIG. 7 is a block diagram for explaining a configuration example of the power source monitoring apparatuses VM3 and VM4 according to the second embodiment.

As illustrated in FIG. 7, as well as the power source monitoring apparatus VM1, the power source monitoring apparatus VM3 includes a voltage converting circuit DA1 and a comparator circuit CA1. Therefore, as well as the power source monitoring apparatus VM1, the power source monitoring apparatus VM3 supplies an output signal OA1 to the semiconductor device SC2. As well as the power source monitoring apparatus VM2, the power source monitoring apparatus VM4 includes the voltage converting circuit DB1 and the comparator circuit CB1. Therefore, as well as the power source monitoring apparatus VM2, the power source monitoring apparatus VM4 supplies the output signal OB1 to the semiconductor device SC1. For that reason, the same numeral reference is assigned to each of the same components, and explanation thereof is omitted.

Namely, the power source monitoring apparatus VM3 does not include a voltage converting circuit DA2 and a comparator circuit CA2 as compared with the power source monitoring apparatus VM1. For this reason, a size of the power source monitoring apparatus VM3 is smaller than a size of the power source monitoring apparatus VM1. Similarly, the power source monitoring apparatus VM4 does not include a voltage converting circuit DB2 and a comparator circuit CB2 as compared with the power source monitoring apparatus VM2. For this reason, a size of the power source monitoring apparatus VM4 is smaller than a size of the power source monitoring apparatus VM2.

Figure 8:
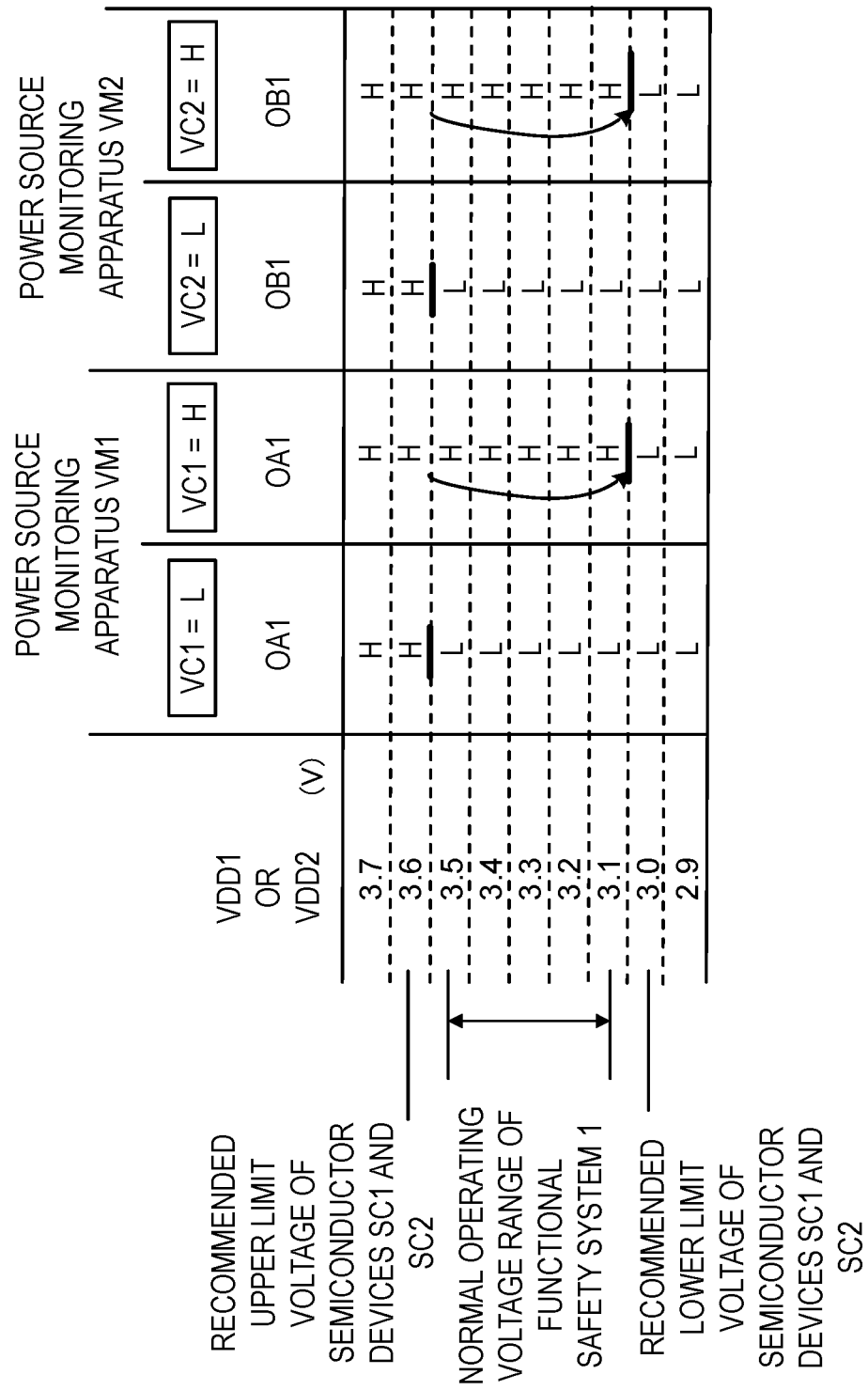
FIG. 8 is a view for explaining an example of an output result of the power source monitoring apparatus according to the second embodiment.

FIG. 8 is a view for explaining an example of output results of the power source monitoring apparatuses VM3 and VM4 according to the second embodiment. As well as FIG. 4, potential levels of the output signals OA1 and OB1 are described in FIG. 8 as the output results (voltage monitoring results) of the power source monitoring apparatuses VM3 and VM4. In FIG. 8, a mark "H" indicates an electrical potential of a High level, and a mark "L" indicates an electrical potential of a Low level.

As illustrated in FIG. 8, similarly to FIG. 4, a normal operating voltage range for the functional safety system 2 is 3.5 V to 3.1 V, for example. Further, as described above, since the output signal OA1 supplied from the power source monitoring apparatus VM3 is the same as the output signal OA1 supplied from the power source monitoring apparatus VM1, a value of the output signal OA1 illustrated in FIG. 8 is the same as the value of the output signal OA1 illustrated in FIG. 4. Further, as described above, since the output signal OB1 supplied from the power source monitoring apparatus VM4 is the same as the output signal OB1 supplied from the power source monitoring apparatus VM2, a value of the output signal OB1 illustrated in FIG. 8 is the same as the value of the output signal OB1 illustrated in FIG. 4. For that reason, detailed description thereof is omitted.

Figure 9:
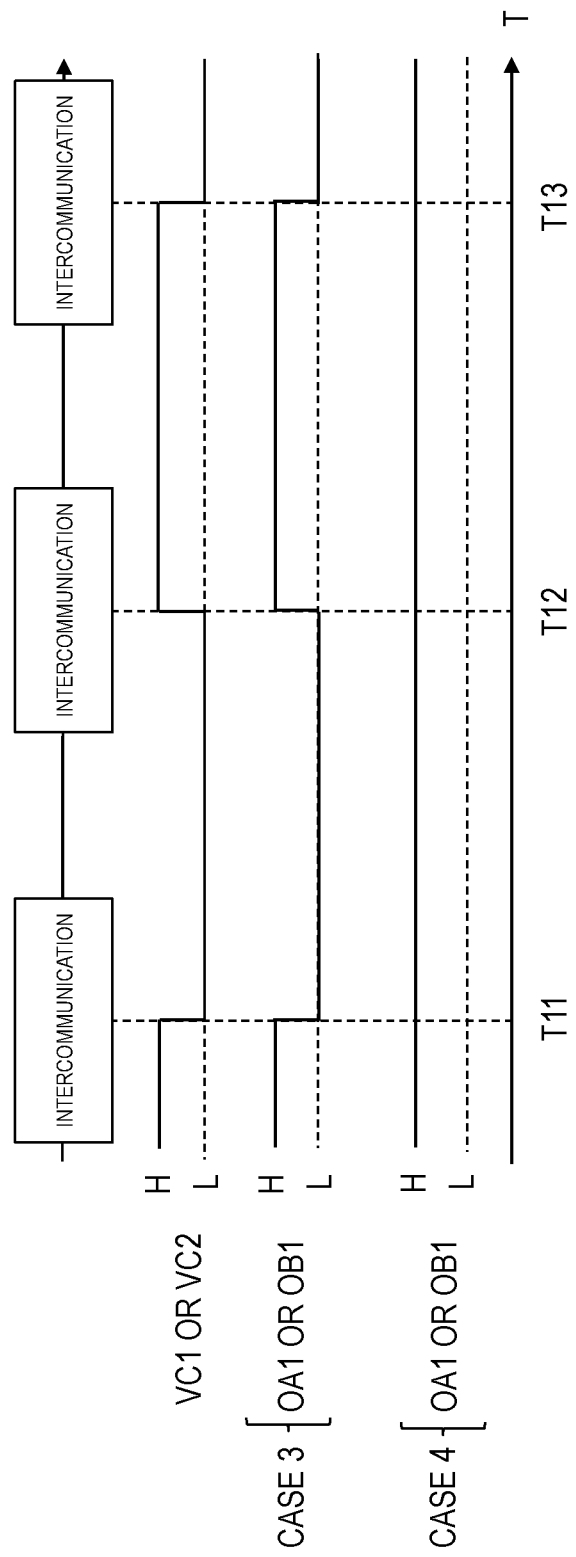
FIG. 9 is a view for explaining an operation of the power source monitoring apparatus according to the second embodiment.

FIG. 9 is a view for explaining operations of the power source monitoring apparatuses VM3 and VM4 according to the second embodiment. FIG. 9 illustrates Case 3 and Case 4 as the operations of the power source monitoring apparatuses VM3 and VM4. Further, in FIG. 9, a mark "H" indicates an electrical potential of the High level, and a mark "L" indicates an electrical potential of the Low level. Moreover, the values that have been explained above are respectively set to expected values E1 and E3.

In FIG. 9, a time T11 corresponds to the time T1 of FIG. 4, a time T12 corresponds to the time T2 of FIG. 4, and a time T13 corresponds to a time T3 of FIG. 4. Further, in FIG. 9, as well as FIG. 4, timing of intercommunication is the same as timing when a potential level of a switching signal VC1 or VC2 varies.

Case 3 corresponds to Case 1 illustrated in FIG. 5. For that reason, this is an example in a case where a value of a power source voltage VDD1 or VDD2 falls within the normal operating voltage range for the functional safety system 2. For that reason, operations of the voltage converting circuit DA1 and the comparator circuit CA1 of the power source monitoring apparatus VM3 in Case 3 are similar to the operations of the voltage converting circuit DA1 and the comparator circuit CA1 of the power source monitoring apparatus VM1 in Case 1. For that reason, detailed description thereof is omitted, but operations of the power source monitoring apparatus VM3 and the semiconductor device SC2 in case of Case 3 will be described below.

At the time T11 in Case 3, the voltage converting circuit DA1 generates a detected voltage VNA1 from the power source voltage VDD1 on the basis of the switching signal VC1 with a Low level. The comparator circuit CA1 compares the detected voltage VNA1 with a reference voltage VreA, and outputs the output signal OA1 with a Low level to the semiconductor device SC2 as the voltage monitoring result in accordance with its comparison result. At the time T11, the semiconductor device SC2 compares the voltage monitoring result (the output signal OA1 with the Low level) with the expected value E3L on the basis of safety control software SW2. Since the voltage monitoring result (the output signal OA1 with the Low level) is the same as the expected value E3L, the motor MT continues to rotate as well as Case 1.

As explained above, the power source monitoring apparatus VM3 can monitor whether the power source voltage VDD1 is lower than an upper limit voltage of the normal operating voltage range for the functional safety system 2 or not while the switching signal VC1 is in the Low level (a period from the time T11 to the time T12). However, the power source monitoring apparatus VM3 is different from the power source monitoring apparatus VM1, and does not include the voltage converting circuit DA2 and the comparator circuit CA2. For that reason, the power source monitoring apparatus VM3 cannot monitor whether the power source voltage VDD1 is higher than a lower limit voltage of the normal operating voltage range for the functional safety system 2 or not while the switching signal VC1 is in the Low level (the period from the time T11 to the time T12).

At the time T12, the voltage converting circuit DA1 generates a detected voltage VNA2 from the power source voltage VDD1 on the basis of the switching signal VC1 with the High level. The comparator circuit CA1 compares the detected voltage VNA2 with the reference voltage VreA, and outputs the output signal OA1 with the High level to the semiconductor device SC2 as the voltage monitoring result in accordance with its comparison result. At the time T12, the semiconductor device SC2 compares the voltage monitoring result (the output signal OA1 with the High level) with the expected value E3H on the basis of the safety control software SW2. Since the voltage monitoring result (the output signal OA1 with the High level) is the same as the expected value E3H, the motor MT continues to rotate as well as Case 1.

The power source monitoring apparatus VM3 can monitor whether the power source voltage VDD1 is higher than the lower limit voltage of the normal operating voltage range for the functional safety system 2 or not while the switching signal VC1 is in the High level (a period from the time T12 to the time T13). On the other hand, the power source monitoring apparatus VM3 is different from the power source monitoring apparatus VM1, and does not include the voltage converting circuit DA2 and the comparator circuit CA2. For that reason, the power source monitoring apparatus VM3 cannot monitor whether the power source voltage VDD1 is lower than the upper limit voltage of the normal operating voltage range for the functional safety system 2 or not while the switching signal VC1 is in the High level.

Therefore, through both of the periods when the switching signal VC1 is in the Low level and the High level, the power source monitoring apparatus VM3 monitors whether the power source voltage VDD1 falls within the normal operating voltage range for the functional safety system 2 or not.

Namely, through both of the periods when the switching signal VC1 is in the Low level and the High level, the semiconductor device SC2 determines whether any of the power source apparatus VS1, the power source wiring VW1, and the power source monitoring apparatus VM1 breaks down or not. Specifically, the semiconductor device SC2 compares the output signal OA1 when the switching signal VC1 is in the Low level with the expected value E3L, and further compares the output signal OA1 when the switching signal VC1 is in the High level with the expected value E3H. As a result, in a case where the output signal OA1 when the switching signal VC1 is in the Low level is different from the expected value E3L or the output signal OA1 when the switching signal VC1 is in the High level is different from the expected value E3H, the semiconductor device SC2 supplies a control signal CS2 (for example, a control signal CS2 with a Low level) to an interruption circuit IN2. Therefore, the interruption circuit IN2 blocks a driving signal DS, whereby a driving operation of the motor MT is stopped. As a result, it is possible to provide the functional safety system 2 with high reliability.

Further, through the times T11 and T12, the power source monitoring apparatus VM3 inverts a potential level of the output signal OA1 in accordance with inversion of the potential level of the switching signal VC1. Therefore, the semiconductor device SC2 can determine whether the power source monitoring apparatus VM3 itself operates normally or not. Therefore, it is possible to provide the functional safety system 2 with higher reliability. Moreover, since a size of the power source monitoring apparatus VM3 is smaller than a size of the power source monitoring apparatus VM1, it is possible to provide miniaturization of the functional safety system 2.

Operations of the voltage converting circuit DB1 and the comparator circuit CB1 of the power source monitoring apparatus VM4 in Case 3 are similar to the operations of the voltage converting circuit DB1 and the comparator circuit CB1 of the power source monitoring apparatus VM2 in Case 1. For that reason, detailed description thereof is omitted, but operations of the power source monitoring apparatus VM4 and the semiconductor device SC1 in case of Case 3 will be described below.

At the time T11 in Case 3, the voltage converting circuit DB1 generates a detected voltage VNB1 from the power source voltage VDD2 on the basis of the switching signal VC2 with a Low level. The comparator circuit CB1 compares the detected voltage VNB1 with a reference voltage VreB, and outputs the output signal OB1 with a Low level to the semiconductor device SC1 as the voltage monitoring result in accordance with its comparison result. At the time T11, the semiconductor device SC1 compares the voltage monitoring result (the output signal OB1 with the Low level) with an expected value E1L on the basis of safety control software SW1. Since the voltage monitoring result (the output signal OB1 with the Low level) is the same as the expected value E1L, the motor MT continues to rotate as well as Case 1. In Case 3, the power source monitoring apparatus VM4 can monitor whether the power source voltage VDD2 is lower than the upper limit voltage of the normal operating voltage range for the functional safety system 2 while the switching signal VC2 is in the Low level (the period from the time T11 to the time T12). However, the power source monitoring apparatus VM4 is different from the power source monitoring apparatus VM2, and does not include the voltage converting circuit DB2 and the comparator circuit CB2. For that reason, the power source monitoring apparatus VM4 cannot monitor whether the power source voltage VDD2 is higher than the lower limit voltage of the normal operating voltage range for the functional safety system 2 while the switching signal VC2 is in the Low level.

At the time T12, the voltage converting circuit DB1 generates a detected voltage VNB2 from the power source voltage VDD2 on the basis of the switching signal VC2 with a High level. The comparator circuit CB1 compares the detected voltage VNB2 with the reference voltage VreB, and outputs the output signal OB1 with the High level to the semiconductor device SC1 as the voltage monitoring result in accordance with its comparison result. At the time T12, the semiconductor device SC1 compares the voltage monitoring result (the output signal OB1 with the High level) with an expected value E1H on the basis of the safety control software SW1. Since the voltage monitoring result (the output signal OB1 with the High level) is the same as the expected value E1H, the motor MT continues to rotate as well as Case 1. In Case 3, the power source monitoring apparatus VM4 can monitor whether the power source voltage VDD2 is higher than the lower limit voltage of the normal operating voltage range for the functional safety system 2 or not while the switching signal VC2 is in the High level (the period from the time T12 to the time T13). On the other hand, the power source monitoring apparatus VM4 is different from the power source monitoring apparatus VM2, and does not include the voltage converting circuit DB2 and the comparator circuit CB2. For that reason, the power source monitoring apparatus VM4 cannot monitor whether the power source voltage VDD2 is lower than the upper limit voltage of the normal operating voltage range for the functional safety system 2 or not while the switching signal VC2 is in the High level.

Therefore, through both of the periods when the switching signal VC2 is in the Low level and the High level, the power source monitoring apparatus VM4 monitors whether the power source voltage VDD2 falls within the normal operating voltage range for the functional safety system 2 or not.

Namely, through both of the periods when the switching signal VC2 is in the Low level and the High level, the semiconductor device SC1 determines whether any of a power source apparatus VS2, a power source wiring VW2, and the power source monitoring apparatus VM2 breaks down or not. Specifically, the semiconductor device SC1 compares the output signal OB1 when the switching signal VC2 is in the Low level with the expected value E1L, and further compares the output signal OB1 when the switching signal VC2 is in the High level with the expected value E1H. As a result, in a case where the output signal OB1 when the switching signal VC2 is in the Low level is different from the expected value E1L or the output signal OB1 when the switching signal VC2 is in the High level is different from the expected value E1H, the semiconductor device SC1 supplies a control signal CS1 (for example, a control signal CS1 with a Low level) to the interruption circuit IN1. Accordingly, the interruption circuit IN1 blocks the driving signal DS, whereby the driving operation of the motor MT is stopped. As a result, it is possible to provide the functional safety system 1 with high reliability.

Further, through the times T11 and T12, the power source monitoring apparatus VM4 inverts a potential level of the output signal OB1 in accordance with inversion of the potential level of the switching signal VC2. For this reason, the semiconductor device SC1 can determine whether the power source monitoring apparatus VM4 itself operates normally or not. Therefore, it is possible to provide the functional safety system 2 with higher reliability. Moreover, since a size of the power source monitoring apparatus VM4 is smaller than a size of the power source monitoring apparatus VM2, it is possible to provide miniaturization of the functional safety system 2.

Case 4 corresponds to Case 2 illustrated in FIG. 5. For that reason, this is an example of a case where the power source voltage VDD1 or VDD2 is higher than the normal operating voltage range for the functional safety system 2. For that reason, operations of the voltage converting circuit DA1 and the comparator circuit CA1 of the power source monitoring apparatus VM3 in Case 4 are similar to the operations of the voltage converting circuit DA1 and the comparator circuit CA1 of the power source monitoring apparatus VM1 in Case 2. For that reason, detailed description thereof is omitted, but operations of the power source monitoring apparatus VM3 and the semiconductor device SC2 in case of Case 4 will be described below.

At the time T11 in Case 4, the voltage converting circuit DA1 generates the detected voltage VNA1 from the power source voltage VDD1 on the basis of the switching signal VC1 with the Low level. The comparator circuit CA1 compares the detected voltage VNA1 with the reference voltage VreA, and outputs the output signal OA1 with the High level to the semiconductor device SC2 as the voltage monitoring result in accordance with its comparison result. At the time T11, the semiconductor device SC2 compares the voltage monitoring result (the output signal OA1 with the High level) with the expected value E3L on the basis of the safety control software SW2. Since the voltage monitoring result (the output signal OA1 with the High level) is different from the expected value E3L, the semiconductor device SC2 supplies the control signal CS2 (for example, the control signal CS2 with the Low level) to the interruption circuit IN2 as well as Case 2. The interruption circuit IN2 blocks the driving signal DS on the basis of the control signal CS2 with the Low level. As a result, a rotational motion of the motor MT is stopped.

Namely, at the time T11, the semiconductor device SC2 determines that the value of the power source voltage VDD1 is outside the operating voltage range for the functional safety system 2. In other words, the semiconductor device SC2 determines that the power source apparatus VS1 or the power source wiring VW1 breaks down. For that reason, the interruption circuit IN2 blocks the driving signal DS supplied from a semiconductor device SC3 on the basis of the control signal CS2 with the Low level. As a result, the rotational motion of the motor MT is stopped. This makes it possible to secure safety of the functional safety system 2.

Operations of the voltage converting circuit DB1 and the comparator circuit CB1 of the power source monitoring apparatus VM4 in Case 4 are similar to the operations of the voltage converting circuit DB1 and the comparator circuit CB1 of the power source monitoring apparatus VM2 in Case 2. For that reason, detailed description thereof is omitted, but operations of the power source monitoring apparatus VM4 and the semiconductor device SC1 in case of Case 4 will be described below.

At the time T11 in Case 4, the voltage converting circuit DB1 generates the detected voltage VNB1 from the power source voltage VDD2 on the basis of the switching signal VC2 with the Low level. The comparator circuit CB1 compares the detected voltage VNB1 with the reference voltage VreB, and outputs the output signal OB1 with the High level to the semiconductor device SC1 as the voltage monitoring result in accordance with its comparison result. At the time T11, the semiconductor device SC1 compares the voltage monitoring result (the output signal OB1 with the High level) with the expected value E1L on the basis of the safety control software SW1. Since the voltage monitoring result (the output signal OB1 with the High level) is different from the expected value E1L, the semiconductor device SC1 supplies the control signal CS1 (for example, the control signal CS1 with the Low level) to the interruption circuit IN1 as well as Case 2. The interruption circuit IN1 blocks the driving signal DS supplied from the semiconductor device SC3 on the basis of the control signal CS1 with the Low level. As a result, the rotational motion of the motor MT is stopped.

Namely, at the time T11, the semiconductor device SC1 determines that the value of the power source voltage VDD2 is outside the operating voltage range for the functional safety system 2. In other words, the semiconductor device SC1 determines that the power source apparatus VS2 or the power source wiring VW2 breaks down while the switching signal VC1 is in the Low level. For that reason, the interruption circuit IN1 blocks the driving signal DS supplied from the semiconductor device SC3 on the basis of the control signal CS1 with the Low level. As a result, the rotational motion of the motor MT is stopped. This makes it possible to secure safety of the functional safety system 2.

Further, although it is not illustrated in FIG. 9, the power source voltage VDD1 or VDD2 may be lower than the normal operating voltage range for the functional safety system 2 due to a breakdown of the power source apparatus VS1 or VS2 or the power source wiring VW1 or VW2. In such a case, the rotational motion of the motor MT is also stopped, and this makes it possible to secure safety of the functional safety system 2. As illustrated in FIG. 8, in a case where the switching signal VC1 is in the High level, the output signal OA1 is in the Low level. For this reason, as described above, the semiconductor device SC2 blocks the driving signal DS. On the other hand, in a case where the switching signal VC2 is in the High level, the output signal OB1 is in the Low level. For this reason, as described above, the semiconductor device SC1 blocks the driving signal DS.

Further, as the functional safety system 2, the output signal OA1 in case of Case 3 may be combined with the output signal OB1 in case of Case 4. In such a case, as described above, the semiconductor device SC2 executes a normal operation, but the semiconductor device SC1 controls the interruption circuit IN1 so as to block supply of the driving signal DS. As a result, the rotational motion of the motor MT is stopped. For that reason, the functional safety system 1 can construct a dual functional safety system using the semiconductor devices SC1 and SC2.

What is claimed is:

1. A functional safety system, comprising:
a first power source apparatus configured to generate a first power source voltage on a basis of an external power source;
a first power source monitoring apparatus configured to receive the first power source voltage, and monitor the first power source voltage;
a first semiconductor device configured to receive the first power source voltage to operate on a basis of the first power source voltage;
a second power source apparatus configured to generate a second power source voltage on a basis of the external power source;
a second power source monitoring apparatus configured to receive the second power source voltage, and monitor the second power source voltage;
a second semiconductor device configured to receive the second power source voltage to operate on a basis of the second power source voltage;
a first interruption circuit controlled by the first semiconductor device;
a second interruption circuit controlled by the second semiconductor device; and
a motor configured to receive a driving signal via the first interruption circuit and the second interruption circuit to operate on a basis of the driving signal,
wherein the first power source monitoring apparatus includes a first voltage converting circuit, a second voltage converting circuit, a first comparator circuit, and a second comparator circuit,
wherein the second semiconductor device has a first target voltage and a second target voltage, reference voltage,
wherein the first voltage converting circuit is configured to generate a first detected voltage from the first power source voltage on a basis of a first switching signal supplied from the second semiconductor device, and apply the first detected voltage to the first comparator circuit,
wherein the second voltage converting circuit is configured to generate a second detected voltage from the first power source voltage on a basis of the first switching signal, and apply the second detected voltage to the second comparator circuit,
wherein the first comparator circuit is configured to compare the first detected voltage with a first reference voltage, and supply a first voltage monitoring result to the second semiconductor device in accordance with a comparison result,
wherein the second comparator circuit is configured to compare the second detected voltage with the first reference voltage, and supply a second voltage monitoring result to the second semiconductor device in accordance with a comparison result, and
wherein the second semiconductor device is configured to control the second interruption circuit so as to block the driving signal to be supplied to the motor in a case where the first voltage monitoring result is different from the first target voltage or the second voltage monitoring result is different from the second target voltage.

2. The functional safety system according to claim 1, wherein the second power source monitoring apparatus includes a third voltage converting circuit, a fourth voltage converting circuit, a third comparator circuit, and a fourth comparator circuit,
wherein the first semiconductor device has a third target voltage and a fourth target voltage,
wherein the third voltage converting circuit is configured to generate a third detected voltage from the second power source voltage on a basis of a second switching signal supplied from the first semiconductor device, and apply the third detected voltage to the third comparator circuit, wherein the fourth voltage converting circuit is configured to generate a fourth detected voltage from the second power source voltage on a basis of the second switching signal, and apply the fourth detected voltage to the fourth comparator circuit, wherein the third comparator circuit is configured to compare the third detected voltage with a second reference voltage, and supply a third voltage monitoring result to the first semiconductor device in accordance with a comparison result, wherein the fourth comparator circuit is configured to compare the fourth detected voltage with the second reference voltage, and supply a fourth voltage monitoring result to the first semiconductor device in accordance with a comparison result, and wherein the first semiconductor device is configured to control the first interruption circuit so as to block the driving signal to be supplied to the motor in a case where the third voltage monitoring result is different from the third target voltage or the fourth voltage monitoring result is different from the fourth target voltage.

3. The functional safety system according to claim 2,
wherein the first target voltage includes a first value and a second value,
wherein the second target voltage includes a third value and a fourth value,
wherein the first detected voltage includes a first divided voltage and a second divided voltage,
wherein the second detected voltage includes a third divided voltage and a fourth divided voltage,
wherein the first voltage monitoring result includes a first result value and a second result value,
wherein the second voltage monitoring result includes a third result value and a fourth result value,
wherein the first voltage converting circuit is configured to apply the first divided voltage to the first comparator circuit as the first detected voltage in a case where the first switching signal is in a Low level,
wherein the first voltage converting circuit is configured to apply the second divided voltage to the first comparator circuit as the first detected voltage in a case where the first switching signal is in a High level,
wherein the second voltage converting circuit is configured to apply the third divided voltage to the second comparator circuit as the second detected voltage in a case where the first switching signal is in the Low level,
wherein the second voltage converting circuit is configured to apply the fourth divided voltage to the second comparator circuit as the second detected voltage in a case where the first switching signal is in the High level,
wherein the first comparator circuit is configured to compare the first divided voltage with the first reference voltage and supply the first result value to the second semiconductor device as the first voltage monitoring result in a case where the first switching signal is in the Low level,
wherein the first comparator circuit is configured to compare the second detected voltage with the first reference voltage and supply the second result value to the second semiconductor device as the first voltage monitoring result in a case where the first switching signal is in the High level, wherein the second comparator circuit is configured to compare the third detected voltage with the first reference voltage and supply the third result value to the second semiconductor device as the second voltage monitoring result in a case where the first switching signal is in the Low level, wherein the second comparator circuit is configured to compare the fourth detected voltage with the first reference voltage and supply the fourth result value to the second semiconductor device as the second voltage monitoring result in a case where the first switching signal is in the High level, wherein the second semiconductor device is configured to control the second interruption circuit so as to block the driving signal to be supplied to the motor in a case where the first result value is different from the first value or the third result value is different from the third value, and wherein the second semiconductor device is configured to control the second interruption circuit so as to block the driving signal to be supplied to the motor in a case where the second result value is different from the second value or the fourth result value is different from the fourth value.

4. The functional safety system according to claim 3, wherein the first switching signal is configured to switch between the High level and the Low level at regular intervals.

5. The functional safety system according to claim 3,
wherein a value of the first divided voltage is different from a value of the second divided voltage,
wherein a value of the third divided voltage is different from a value of the fourth divided voltage,
wherein a value of the first divided voltage is different from a value of the third divided voltage, and
wherein a value of the second divided voltage is different from a value of the fourth divided voltage.

6. The functional safety system according to claim 3, further comprising:
a third power source apparatus configured to generate a third power source voltage on a basis of the external power source; and
a third semiconductor device configured to receive the third power source voltage to operate on a basis of the third power source voltage,
wherein the third semiconductor device is configured to supply the driving signal to the motor via the first and second interruption circuits.

7. The functional safety system according to claim 3, wherein the first semiconductor device and the second semiconductor device execute intercommunication with each other at regular intervals to monitor operations each other.

8. The functional safety system according to claim 7, wherein timing when the intercommunication is executed is same as timing when a potential level of the first switching signal is varied.

9. The functional safety system according to claim 3,
wherein the first voltage converting circuit includes:
a first resistor connected to a voltage node to which the first power source voltage is applied;
a second resistor connected to the voltage node in parallel to the first resistor and arranged between the voltage node and a first detected voltage node;

a third resistor connected to the second resistor in series via the first detected voltage node and arranged between the first detected voltage node and a ground voltage node; and a first switch arranged between the first detected voltage node and the first resistor, wherein the second voltage converting circuit includes:

a fourth resistor connected to the voltage node and arranged between the voltage node and a second detected voltage node;

a fifth resistor connected to the fourth resistor in series via the second detected voltage node and arranged between the second detected voltage node and the ground voltage node;

a sixth resistor connected to the ground voltage node in parallel to the fifth resistor; and a second switch arranged between the second detected voltage node and the sixth resistor, wherein the first comparator circuit is connected to the first detected voltage node, wherein the second comparator circuit is connected to the second detected voltage node, and wherein each of the first and second switches is set to either an ON state or an OFF state in accordance with the first switching signal.

10. A functional safety system, comprising:

a first power source apparatus configured to generate a first power source voltage on a basis of an external power source and apply the first power source voltage to a first power source wiring;

a first power source monitoring apparatus connected to the first power source wiring, the first power source monitoring apparatus being configured to monitor an electrical potential of the first power source wiring;

a first semiconductor device connected to the first power source wiring, the first semiconductor device being configured to operate on a basis of the first power source voltage;

a second power source apparatus configured to generate a second power source voltage on a basis of the external power source to apply the second power source voltage to a second power source wiring;

a second power source monitoring apparatus connected to the second power source wiring, the second power source monitoring apparatus being configured to monitor an electrical potential of the second power source wiring;

a second semiconductor device connected to the second power source wiring, the second semiconductor device being configured to operate on a basis of the second power source voltage;

a first interruption circuit controlled by the first semiconductor device;

a second interruption circuit controlled by the second semiconductor device; and a motor configured to receive a driving signal via the first interruption circuit and the second interruption circuit to operate on a basis of the driving signal, wherein the first power source monitoring apparatus includes a first voltage converting circuit, a second voltage converting circuit, a first comparator circuit, and a second comparator circuit, wherein the second semiconductor device has a first target voltage and a second target voltage, wherein the first voltage converting circuit is configured to generate a first detected voltage from the first power source voltage on a basis of a first switching signal supplied from the second semiconductor device, and apply the first detected voltage to the first comparator circuit, wherein the second voltage converting circuit is configured to generate a second detected voltage from the first power source voltage on a basis of the first switching signal, and apply the second detected voltage to the second comparator circuit, wherein the first comparator circuit is configured to compare the first detected voltage with a first reference voltage, and supply a first voltage monitoring result to the second semiconductor device in accordance with a comparison result, wherein the second comparator circuit is configured to compare the second detected voltage with the first reference voltage, and supply a second voltage monitoring result to the second semiconductor device in accordance with a comparison result, and wherein the second semiconductor device is configured to control the second interruption circuit so as to block the driving signal to be supplied to the motor in a case where the first voltage monitoring result is different from the first target voltage or the second voltage monitoring result is different from the second target voltage.

11. The functional safety system according to claim 10, wherein the first detected voltage varies on a basis of a potential level of the first switching signal, and wherein the second detected voltage varies on a basis of the potential level of the first switching signal.

12. The functional safety system according to claim 11, wherein the first voltage converting circuit includes:

a first resistor connected to the first power source wiring;

a second resistor connected to the first power source wiring in parallel to the first resistor and arranged between the first power source wiring and first detected voltage node;

a third resistor connected to the second resistor in series via the first detected voltage node and arranged between the first detected voltage node and a ground voltage node; and a first switch arranged between the first detected voltage node and the first resistor, wherein the second voltage converting circuit includes:

a fourth resistor connected to the first power source wiring and arranged between the first power source wiring and second detected voltage node;

a fifth resistor connected to the fourth resistor in series via the second detected voltage node and arranged between the second detected voltage node and the ground voltage node;

a sixth resistor connected to the ground voltage node in parallel to the fifth resistor; and a second switch arranged between the second detected voltage node and the sixth resistor, wherein the first comparator circuit is connected to the first detected voltage node, wherein the second comparator circuit is connected to the second detected voltage node, and wherein each of the first and second switches is set to either an ON state or an OFF state in accordance with the first switching signal.

13. The functional safety system according to claim 11, wherein the second power source monitoring apparatus includes a third voltage converting circuit, a fourth voltage converting circuit, a third comparator circuit, and a fourth comparator circuit, wherein the first semiconductor device has a third target voltage and a fourth target voltage, wherein the third voltage converting circuit is configured to generate a third detected voltage from the second power source voltage on a basis of a second switching signal supplied from the first semiconductor device, and apply the third detected voltage to the third comparator circuit, wherein the fourth voltage converting circuit is configured to generate a fourth detected voltage from the second power source voltage on a basis of the second switching signal, and apply the fourth detected voltage to the fourth comparator circuit, wherein the third comparator circuit is configured to compare the third detected voltage with a second reference voltage, and supply a third voltage monitoring result to the first semiconductor device in accordance with a comparison result, wherein the fourth comparator circuit is configured to compare the fourth detected voltage with the second reference voltage, and supply a fourth voltage monitoring result to the first semiconductor device in accordance with a comparison result, and wherein the first semiconductor device is configured to control the first interruption circuit so as to block the driving signal to be supplied to the motor in a case where the third voltage monitoring result is different from the third target voltage or the fourth voltage monitoring result is different from the fourth target voltage.

14. The functional safety system according to claim 13, wherein the third detected voltage varies on a basis of a potential level of the second switching signal, and wherein the fourth detected voltage varies on a basis of the potential level of the second switching signal.

15. A functional safety system, comprising:
a first power source apparatus configured to generate a first power source voltage on a basis of an external power source;
a power source monitoring apparatus configured to receive the first power source voltage, and monitor the first power source voltage;
a first semiconductor device configured to receive the first power source voltage to operate on a basis of the first power source voltage;
a second power source apparatus configured to generate a second power source voltage on a basis of the external power source;
a second semiconductor device configured to receive the second power source voltage to operate on a basis of the second power source voltage;
an interruption circuit controlled by the second semiconductor device; and
a motor configured to receive a driving signal via the interruption circuit to operate on a basis of the driving signal, wherein the power source monitoring apparatus includes a voltage converting circuit and a comparator circuit, wherein the second semiconductor device has a first value and a second value as a target voltage, wherein the voltage converting circuit is configured to generate a first divided voltage from the first power source voltage on a basis of a switching signal with a Low level, which is supplied from the second semiconductor device, and apply the first divided voltage to the comparator circuit, wherein the voltage converting circuit is configured to generate a second divided voltage from the first power source voltage on a basis of the switching signal with a High level, and apply the second divided voltage to the comparator circuit, wherein the comparator circuit is configured to compare the first divided voltage with a reference voltage to supply a first result value to the second semiconductor device on a basis of a comparison result thereof, wherein the comparator circuit is further configured to compare the first divided voltage with the reference voltage to supply a second result value to the second semiconductor device on a basis of a comparison result thereof, and wherein the second semiconductor device is configured to control the interruption circuit so as to block the driving signal to be supplied to the motor in a case where the first result value is different from the first value or the second result value is different from the second value.

16. The functional safety system according to claim 15, wherein the first divided voltage has a value different from that of the second divided voltage.

17. The functional safety system according to claim 15, wherein the comparator circuit is configured to supply the first result value to the second semiconductor device when the switching signal is in the Low level, wherein the comparator circuit is configured to supply the second result value to the second semiconductor device when the switching signal is in the High level, wherein the second semiconductor device is configured to compare the first result value with the first value when the switching signal is in the Low level, and wherein the second semiconductor device is configured to compare the second result value with the second value when the switching signal is in the High level.

18. The functional safety system according to claim 17, wherein the voltage converting circuit includes:
a first resistor connected to a voltage node to which the first power source voltage is applied;
a second resistor connected to the voltage node in parallel to the first resistor and arranged between the voltage node and a detected voltage node;
a third resistor connected to the second resistor in series via the detected voltage node and arranged between the detected voltage node and a ground voltage node; and
a switch arranged between the detected voltage node and the first resistor, and wherein the switch is set to either an ON state or an OFF state in accordance with the switching signal.

19. The functional safety system according to claim 18, wherein the first semiconductor device and the second semiconductor device execute intercommunication with each other at regular intervals to monitor operations each other.

20. The functional safety system according to claim 19, wherein timing when the intercommunication is executed is same as timing when a potential level of the switching signal is varied.

* * * * *